(12) United States Patent
Odanaka et al.

(10) Patent No.: US 6,184,553 B1
(45) Date of Patent: Feb. 6, 2001

(54) NONVOLATILE SEMICONDUCTOR MEMORY DEVICE AND METHOD FOR FABRICATING THE SAME, AND SEMICONDUCTOR INTEGRATED CIRCUIT DEVICE

(75) Inventors: Shinji Odanaka; Kaori Akamatsu; Junichi Kato; Atsushi Hori, all of Osaka (JP); Seiki Ogura, Wappingers Falls, NY (US)

(73) Assignees: Matsushita Electric Industrial Co., Ltd., Osaka (JP); Halo LSI Design and Device Technologies, Inc., Wappingers Falls, NY (US)

( * ) Notice: Under 35 U.S.C. 154(b), the term of this patent shall be extended for 0 days.

(21) Appl. No.: 09/325,772

(22) Filed: Jun. 4, 1999

Related U.S. Application Data

(63) Continuation of application No. 09/008,572, filed on Jan. 16, 1998, now Pat. No. 6,051,860.

(51) Int. Cl.$^7$ .................................................. H07L 27/115
(52) U.S. Cl. ............................................ 257/317; 257/321
(58) Field of Search ..................................... 257/314–321

(56) References Cited

U.S. PATENT DOCUMENTS

| 5,477,072 | * | 12/1995 | Goo | 257/316 |
| 5,502,321 | * | 3/1996 | Matsushita | 257/316 |
| 5,519,653 | | 5/1996 | Thomas | 365/185.01 |
| 5,721,442 | | 2/1998 | Hong | 257/316 |
| 5,780,341 | | 7/1998 | Ogura | 438/259 |
| 5,982,669 | * | 11/1999 | Kalnitsky et al. | 257/314 |

FOREIGN PATENT DOCUMENTS

| 0273 728 | 7/1988 | (EP) . |
| 0 718 895 | 6/1996 | (EP) . |
| 0 847 091 | 6/1998 | (EP) . |
| 07115142 | 5/1995 | (JP) . |

OTHER PUBLICATIONS

Partial European Search Report dated Jan. 17, 2000.

* cited by examiner

*Primary Examiner*—David Hardy
(74) *Attorney, Agent, or Firm*—McDermott, Will & Emery

(57) ABSTRACT

In a semiconductor substrate having a surface including a first surface region at a first level, a second surface region at a second level lower than the first level, and a step side region linking the first surface region and the second surface region together, a channel region has a triple structure. Thus, a high electric field is formed in a corner portion between the step side region and the second surface region and in the vicinity thereof. A high electric field is also formed in the first surface region. As a result, the efficiency, with which electrons are injected into a floating gate, is considerably increased.

21 Claims, 25 Drawing Sheets

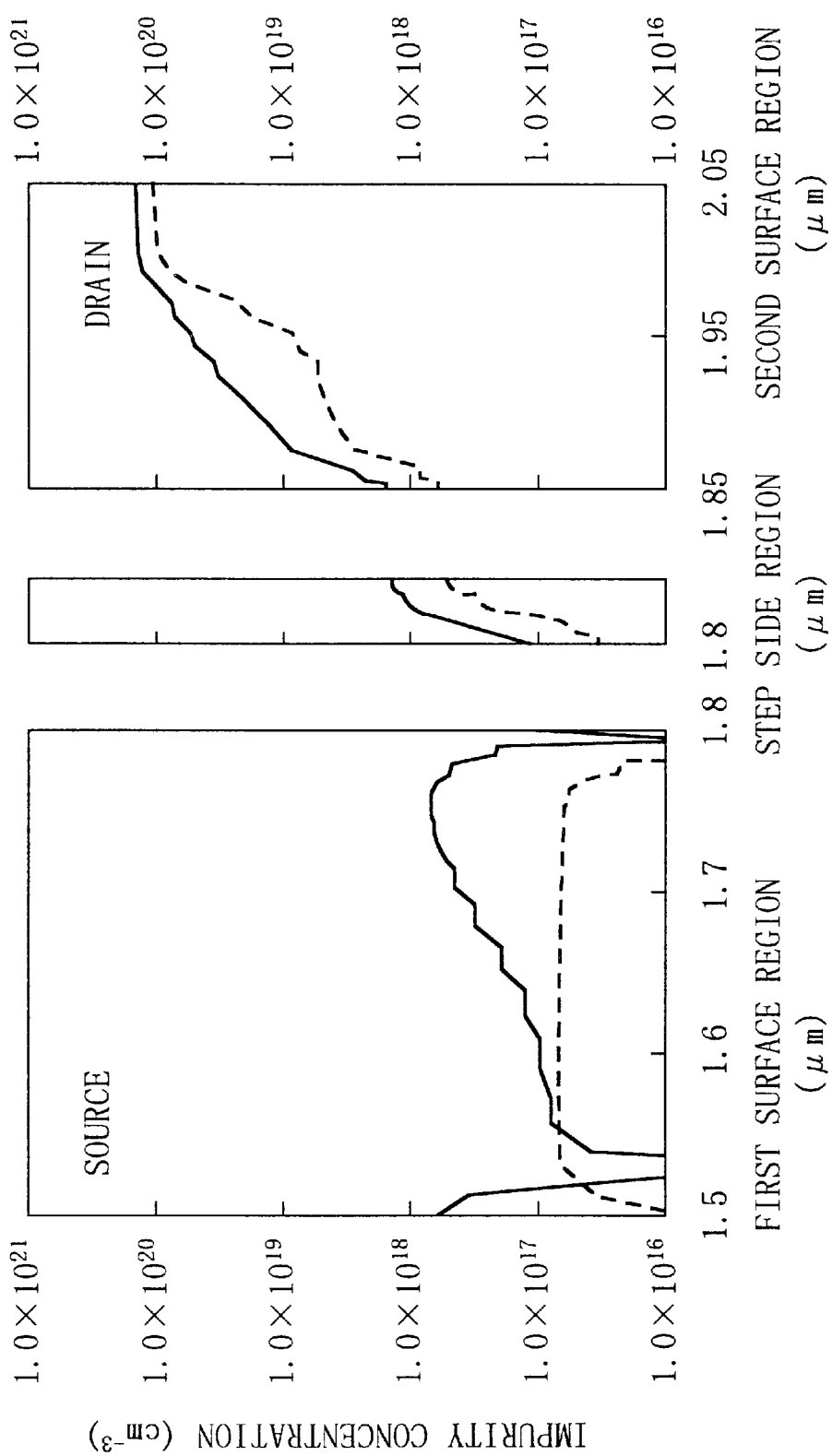

NONVOLATILE SEMICONDUCTOR MEMORY DEVICE AND METHOD FOR FABRICATING THE SAME, AND SEMICONDUCTOR INTEGRATED CIRCUIT DEVICE

This is a continuation application of Ser. No. 09/008,572, filed Jan. 16, 1998 now U.S. Pat. No. 6,051,860.

BACKGROUND OF THE INVENTION

The present invention relates to a nonvolatile semiconductor memory device and a method for fabricating the same, and also relates to a semiconductor integrated circuit device.

In memories for portable units and memory-incorporated logic VLSI's, the technologies for nonvolatile memories have become increasingly important because it is demanded to reduce the costs per bit and to enhance electrical rewrite functions. For such purposes, various structures and fabrication processes have been suggested.

Hereinafter, conventional nonvolatile memories will be described while giving the outlines of such structures and processes.

FIG. 23 shows the cross section of a nonvolatile semiconductor memory device having a so-called "split-gate type" structure. Such a device was suggested by G. Samchisa et al. in IEEE J. Solid-State Circuits, pp. 676, 1987.

In the device shown in FIG. 23, a tunnel oxide film 102, a floating gate 103 and a capacitive insulating film 104 are formed on the upper surface of a semiconductor substrate 101. A control gate 105 is further formed so as to cover the floating gate 103. Also, in the semiconductor substrate 101, a source region 106, which have been doped with an impurity at a high concentration, is formed in a region partially overlapping with the control gate 105, and a drain region 107, which have been doped with an impurity at a high concentration, is formed in a region partially overlapping with the floating gate 103.

The device shown in FIG. 23 has a so-called "split-gate structure" in which the control gate 105 and the floating gate 102 are disposed via the capacitive insulating film over a channel region between the source region 106 and the drain region 107. The floating gate 103 functions as a node in which information is stored and the charged states thereof are made to correspond to "0" and "1" of the information. By utilizing the fact that the threshold voltage as viewed from the control gate 105 is varied in accordance with the amount of charge accumulated in the floating gate 103, the reading of data is performed.

The writing of data utilizes a strong lateral high electric field, which is generated in a boundary between a "drain potential expansion region" in a region immediately under the floating gate 103 and an "inversion channel region" in a region immediately under the control gate 105. By utilizing the phenomenon that channel hot electrons, which have obtained high energy as a result of the acceleration caused by the lateral high electric field, are injected into the oxide film so as to reach the floating gate 102, a relatively high electron injection efficiency is achieved. Such an electron injection is called a "source-side injection".

The erasure of data is performed by taking out the electrons in the floating gate 103 into the drain region 107 by the use of a Fowler-Nordheim (FN) tunneling phenomenon. In order to utilize the FN tunneling phenomenon, a high electric field of about 10.5 MV/cm to about 11 MV/cm is required to be formed in the oxide film 102. Since the tunnel oxide film 102 of the device of the above-cited document is as thick as 20 nm, a high voltage of about 21 V is applied to the drain region 107 when data is erased.

Since the structure shown in FIG. 23 uses the drain region 107 in both cases of writing and erasing data, the compatibility between the operating speed and the reliability is insufficient.

In order to make the operating speed and the reliability compatible, a device shown in FIG. 24 has been proposed. This device was disclosed by S. Kianian et al. in IEEE Symposium VLSI Technology 1994, Digest of Technical Papers, pp. 71.

In the device shown in FIG. 24, a gate oxide film 204, a floating gate 203 and a control gate 205 partially overlapping with the floating gate 203 are formed over a semiconductor substrate 201. In the semiconductor substrate 201, an extremely thick source region 206, which have been doped with an impurity at a high concentration, is formed in a region partially overlapping with the floating gate 203, and a drain region 207, which have been doped with an impurity at a high concentration, is formed in a region partially overlapping with the control gate 205. And the control gate 205 and the floating gate 203 are disposed via a tunnel oxide film 202 over a channel region between the source region 206 and the drain region 207.

The writing of data utilizes a strong lateral high electric field which is generated in a boundary between an "expansion region" of a high potential in the channel region (the "expansion region" has been generated by applying a voltage as high as 11 V to the source region 206) and an "inversion channel region" in a region immediately under the control gate 205. A phenomenon that channel hot electrons, which have obtained high energy by the lateral high electric field, are injected into the oxide film so as to reach the floating gate 203 is utilized. This data write operation is performed by exchanging the voltages to be applied to the source region 206 and the drain region 207 with each other. However, in the other respects, this operation is performed in the same way as the data write operation performed by the device shown in FIG. 23. In the device shown in FIG. 24, the injection efficiency is further increased by the thick source region 206 which is capacitively coupled to the floating gate 203.

The erasure of data is performed by taking out the to electrons in the floating gate 203 into the control gate 205 by applying a voltage of about 14 V to the control gate 205 and by utilizing the FN tunneling phenomenon, thereby trying to improve the erasure characteristics. In the device shown in FIG. 24, the effective channel length is decreased by the thick source region 206 which is employed for increasing the capacitance coupling with the floating gate 203. Thus, this device is not appropriate for further reducing the size of a memory cell.

FIG. 25 shows the cross section of a nonvolatile semiconductor memory device which is designed to shorten a write time or to reduce a write voltage by increasing a write efficiency. This device is disclosed by Nakao, et al. in Japanese Laid-Open Publication No. 7-115142.

The device shown in FIG. 25 uses a semiconductor substrate 301 with a step 302 formed on the surface thereof. The surface of the semiconductor substrate 301 is divided by this step 302 into a surface at a relatively high level (first surface region) and a surface at a relatively low level (second surface region). A tunnel oxide film 303, a floating gate 304, a capacitive insulating film 305 and a control gate 306 are stacked in this order over the step 302. In the surface of the semiconductor substrate 301, a high-concentration source region 307 and a high-concentration drain region 308, both of which have been doped with an impurity at a high concentration, are formed. A thin high-concentration impurity layer (having a thickness of 0.1 μm or less) 309 extends from the high-concentration drain region 308 along the sides of the step 302 to reach the first surface region. Since the thin high-concentration impurity layer 309 functions as a drain region, the region between the high-concentration source region 307 and the high-concentration impurity layer 309 becomes a channel region. The floating gate 103 is formed so as to overlap the channel region and to cover the high-concentration impurity layer 309.

In such a structure, since the floating gate 304 is located in the directions of the velocity vectors of channel hot electrons, the channel hot electron injection efficiency is presumably increased.

Next, a method for fabricating the nonvolatile semiconductor memory device shown in FIG. 25 will be described with reference to FIGS. 26A to 26E.

First, as shown in FIG. 26A, an oxide film 311 is formed as a mask for forming a step in the semiconductor substrate 301 made of p-type silicon. Thereafter, a part of the oxide film in the region where the step is to be formed is etched by a commonly used patterning technique. Then, the semiconductor substrate 301 is etched by using the oxide film 311 as a mask, thereby forming a step in the surface of the semiconductor substrate 301. Subsequently, As ions are implanted into the whole of the step side region and the second surface region at a relatively high dose of $1.0 \times 10^{15}$ $cm^{-2}$ and with an acceleration energy of 20 keV. This ion implantation is performed by a large-angle-tilt ion implantation technique in which the implantation angle is set at 30 degrees. As a result, as shown in FIG. 26B, the thin high-concentration impurity layer 309 is formed in the whole of the step side region and the second surface region. It is described in the above-cited document that the high-concentration impurity layer 309 thermally diffuses during the fabrication process and it is also described therein that the resulting thickness thereof after the fabrication process is completed becomes 0.05 μm. Next, as shown in FIG. 26C, the oxide film 311 is removed and then the surface of the semiconductor substrate 301 is thermally oxidized, thereby forming the tunnel oxide film 303 as a first insulating layer so that the film has a thickness of 10 nm. Furthermore, CVD poly-silicon having a thickness of 200 nm is deposited thereon, thereby forming the floating gate 304. A second insulating film (thickness: 20 nm) 305 functioning as a capacitive insulating film is formed on the floating gate 304 by thermally oxidizing the surface of the floating gate 304. Thereafter, a CVD poly-silicon film having a thickness of 200 nm is deposited thereon, thereby forming the control gate 306.

The floating gate 304, the capacitive insulating film 305 and the control gate 306 are patterned as shown in FIG. 26D. And then, as shown in FIG. 26E, As ions are implanted into the semiconductor substrate 1 at a dose of $3.0 \times 10^{15}$ $cm^{-2}$ and with an acceleration energy of 50 keV, thereby forming the high-concentration source region 307 and the high-concentration drain region 308.

In the nonvolatile semiconductor memory device shown in FIG. 25, since the floating gate 304 is formed in the directions of the velocity vectors of channel hot electrons, the channel hot electron injection efficiency is allegedly increased. For such a purpose, a thin drain layer having a symmetric impurity concentration is formed as a high-concentration impurity layer so as to uniformly cover the step by implanting As ions by a large-angle-tilt ion implantation in which the implantation angle is set at 30 degrees, the acceleration energy is set at as low as 20 keV and the dose is set at $1.0 \times 10^{15}$ $cm^{-2}$. The resulting impurity concentration thereof reaches $1.00 \times 10^{20}$ $cm^{-3}$.

Since the devices shown in FIGS. 23 and 25 utilize the FN tunneling phenomenon for erasing data, abrupt band bending and a high electric field are generated at the edge of the drain region in the vicinity of the surface thereof, and the holes, which have been generated by the band-to-band tunneling current, are injected into the oxide film. As a result, a variation is caused in erasure characteristics and a retention margin and a write disturb margin are degraded. Particularly when data is erased from a large block, it takes a time 100 times or more as long as the time required for one-bit erasure. Thus, in a memory cell having a weak resistance, the retention margin is seriously degraded. In addition, even when the drain voltage is restricted to about 1.5 V for reading, it is still impossible to suppress the degradation of the read disturb margin.

In the device shown in FIG. 25, since the high-concentration drain layer reaches the surface of the upper part of the step, the electron injection efficiency cannot be increased and the variation in erasure characteristics and the degradation of the write disturb margin and the read disturb margin cannot be suppressed. The reasons thereof are as follows. At the edge of the high-concentration drain layer, a drain potential, which has been applied to the drain region in a corner portion in the upper part of the step, can be retained. However, the horizontal electric field intensity dramatically decreases in the high-concentration drain layer and the energy of hot electrons decreases in the interface with the semiconductor substrate in the step side region. Though some distance differential is generated by the non-equilibrium transportation between the position of the peak of electric field and the position of an average energy peak of electrons, the differential is approximately on the order of a mean free path. In a silicon crystal, the differential is about 10 nm. As the difference between the thickness of the thin drain layer and this value increases, the energy of electrons in the silicon interface in the step side region exponentially decreases so that the electron injection efficiency is decreased. That is to say, this structure requires an extremely thin drain layer. Furthermore, in the high-concentration drain layer, the hot electrons come into contact with the electrons in a thermal equilibrium state, thereby scattering the electrons, making the directions of the electron velocity vectors less aligned with the direction of the electric field and resulting in a decrease of the electron injection efficiency. Thus, for example, if the impurity concentration within the drain layer is symmetrically decreased so as to suppress the scattering of electrons within the drain layer, then the drain potential drops in the extremely thin drain layer formed along the side and the bottom of the step, the drain potential also drops in the corner portion in the upper part of the step and the horizontal electric field intensity decreases between the drain layer and the channel. As a result, the electron injection efficiency also decreases in the step side region.

Moreover, this structure cannot erase data by taking out electrons from the floating gate into the drain layer by utilizing the Fowler-Nordheim (FN) tunneling phenomenon. Since the high-concentration drain layer is in contact with the channel region, it is necessary, for example, to apply an electric field weakening diffusion layer surrounding the high-concentration drain region, in order to suppress the generation of the band-to-band tunneling current during erasure. However, in such a case, the electron injection efficiency is extremely decreased during writing, and such a structure cannot be fabricated at a very small size because of a short channel effect.

Furthermore, even when the drain voltage is restricted to about 1.5 V during reading, the read disturb margin is still degraded by the thin high-concentration drain layer.

An objective of the present invention is providing a nonvolatile semiconductor memory device which can remarkably increase an electron injection efficiency, thereby enabling a high-speed write operation and a low-power-consumption operation.

Another objective of the present invention is providing a nonvolatile semiconductor memory device suitable for very large-scale integration.

Still another objective of the present invention is providing a nonvolatile semiconductor memory device which can erase data by taking out electrons from a floating gate into a control gate or a drain region.

Still another objective of the present invention is providing a nonvolatile semiconductor memory device which can improve the erasure characteristics by suppressing the injection of holes into an oxide film when data is erased.

Still another objective of the present invention is providing a nonvolatile semiconductor memory device which can suppress the degradation of a read disturb margin and which can increase a high-speed read ability.

Yet another objectives of the present invention are providing a method for fabricating the nonvolatile semiconductor memory device and providing a semiconductor integrated circuit device including such a nonvolatile semiconductor memory device.

SUMMARY OF THE INVENTION

A nonvolatile semiconductor memory device of the present invention is a nonvolatile semiconductor memory device including: a semiconductor substrate having a surface including a first surface region at a first level, a second surface region at a second level lower than the first level and a step side region linking the first surface region and the second surface region together; a channel region formed in the first surface region of the semiconductor substrate; a source region and a drain region which are formed in the surface of the semiconductor substrate so as to interpose the channel region therebetween; a first insulating film formed on the surface of the semiconductor substrate; a floating gate formed on the first insulating film; and a control gate which is capacitively coupled to the floating gate via a second insulating film. The control gate is formed on the first insulating film. The drain region includes a low-concentration impurity layer which is formed in the second surface region, covers a corner portion between the second surface region and the step side region and does not reach the first surface region, and a high-concentration impurity layer which is connected to the low-concentration impurity layer and which is formed in a region distant from the channel region. An impurity concentration of the low-concentration impurity layer is lower than an impurity concentration of the high-concentration impurity layer. The floating gate covers a part of the first surface region, the step side region and a part of the second surface region via the first insulating film.

Another nonvolatile semiconductor memory device of the present invention is a nonvolatile semiconductor memory device including: a semiconductor substrate having a surface including a first surface region at a first level, a second surface region at a second level lower than the first level and a step side region linking the first surface region and the second surface region together; a channel region formed in the first surface region of the semiconductor substrate; a source region and a drain region which are formed in the surface of the semiconductor substrate so as to interpose the channel region therebetween; a first insulating film formed on the surface of the semiconductor substrate; a floating gate formed on the first insulating film; and a control gate which is capacitively coupled to the floating gate via a second insulating film. The control gate is formed on the first insulating film. The channel region includes: a first low-concentration impurity layer which is formed in a region adjacent to the source region; a second low-concentration impurity region formed in the step side region; and a high-concentration impurity layer formed between the first low-concentration impurity region and the second low-concentration impurity layer. Impurity concentrations of the first and the second low-concentration impurity layers are lower than an impurity concentration of the high-concentration impurity layer. The floating gate covers the second low-concentration impurity layer of the channel region and at least a part of a low-concentration impurity layer of the drain region via the first insulating film.

Still another nonvolatile semiconductor memory device of the present invention is a nonvolatile semiconductor memory device including: a semiconductor substrate having a surface including a first surface region at a first level, a second surface region at a second level lower than the first level and a step side region linking the first surface region and the second surface region together; a channel region formed in the first surface region of the semiconductor substrate; a source region and a drain region which are formed in the surface of the semiconductor substrate so as to interpose the channel region therebetween; a first insulating film formed on the surface of the semiconductor substrate; a floating gate formed on the first insulating film; and a control gate which is capacitively coupled to the floating gate via a second insulating film. The control gate is formed on the first insulating film. The drain region includes a low-concentration impurity layer which is formed in the second surface region, covers a corner portion between the second surface region and the step side region and reaches the first surface region, and a high-concentration impurity layer which is connected to the low-concentration impurity layer and which is formed in a region distant from the channel region. An impurity concentration of the low-concentration impurity layer is lower than an impurity concentration of the high-concentration impurity layer. The floating gate covers the step side region and at least a part of the low-concentration impurity layer via the first insulating film.

Yet another nonvolatile semiconductor memory device of the present invention is a nonvolatile semiconductor memory device including: a semiconductor substrate having a concave portion in a surface thereof; and a floating gate having a surface which faces a corner portion between a bottom of the concave portion and a side of the concave portion. A control gate, which is capacitively coupled to the floating gate, is formed over a channel region. In writing data, hot electrons are generated inside the semiconductor, and at least a part of the hot electrons are injected from the corner portion of the concave portion into the floating gate.

A method for fabricating a nonvolatile semiconductor memory device according to the present invention includes the steps of: forming a first insulating film on a semiconductor substrate; forming a control gate on the first insulating film; forming a second insulating film on sides of the control gate; forming an insulating sidewall on the side of the second insulating film; etching the surface of the semiconductor substrate by using the control gate, the second insulating film and the insulating sidewall as a mask, thereby forming, in the semiconductor substrate, a concave portion having a step side at a position aligned with a position of an edge of the insulating sidewall; forming a low-concentration impurity layer, functioning as a part of a drain region, in the concave portion of the semiconductor substrate; removing the insulating sidewall; and forming a floating gate, overlapping the step side, in a region adjacent to the control gate.

Another method for fabricating a nonvolatile semiconductor memory device according to the present invention includes the steps of: covering a selected area of a semiconductor substrate with a mask; forming a high-concentration channel region, having a conductivity type opposite to a conductivity type of a drain region, and an extremely-low-concentration channel region, having the same conductivity type as the conductivity type of the drain region, in the semiconductor substrate by using the mask; forming a concave portion in the semiconductor substrate by etching the semiconductor substrate by using the mask; forming a low-concentration drain region in the concave portion in the semiconductor substrate; forming a first insulating film on the semiconductor substrate; forming a floating gate which faces a step side via a part of the first insulating film; a second insulating film over a side and a part of an upper surface of the floating gate; and forming a control gate having a surface facing the semiconductor substrate via a part of the first insulating film and a surface facing the floating gate via the second insulating film. The low-concentration drain region is formed under a bottom of the concave portion.

Still another method for fabricating a nonvolatile semiconductor memory device according to the present invention includes the steps of: covering a selected area of a semiconductor substrate with a mask; forming a high-concentration channel region, having a conductivity type opposite to a conductivity type of a drain region, and an extremely-low-concentration channel region, having the conductivity type opposite to the conductivity type of the drain region, in the semiconductor substrate by using the mask; forming a concave portion in the semiconductor substrate by etching the semiconductor substrate by using the mask; forming a low-concentration drain region in the concave portion in the semiconductor substrate; forming a first insulating film on the semiconductor substrate; forming a floating gate which faces a step side via a part of the first insulating film; a second insulating film over a side and a part of an upper surface of the floating gate; and forming a control gate having a surface facing the semiconductor substrate via a part of the first insulating film and a surface facing the floating gate via the second insulating film. The low-concentration drain region is formed under a bottom of the concave portion.

A semiconductor integrated circuit device of the present invention is a semiconductor integrated circuit device including a plurality of nonvolatile memory cells and further includes: a semiconductor substrate having a surface including a first surface region at a first level, a second surface region at a second level lower than the first level, and a step side region linking the first surface region and the second surface region together; and a driver circuit, formed on the semiconductor substrate, for driving the plurality of nonvolatile memory cells. Each of the nonvolatile memory cells is a nonvolatile semiconductor memory device including: a channel region formed in the first surface region of the semiconductor substrate; a source region and a drain region which are formed in the surface of the semiconductor substrate so as to interpose the channel region therebetween; a first insulating film formed on the surface of the semiconductor substrate; a floating gate formed on the first insulating film; and a control gate which is capacitively coupled to the floating gate via a second insulating film. The control gate is formed on the first insulating film. The drain region includes a low-concentration impurity layer which is formed in the second surface region, covers a corner portion between the second surface region and the step side region and does not reach the first surface region, and a high-concentration impurity layer which is connected to the low-concentration impurity layer and which is formed in a region distant from the channel region. An impurity concentration of the low-concentration impurity layer is lower than an impurity concentration of the high-concentration impurity layer. The floating gate covers a part of the first surface region, the step side region and a part of the second surface region via the first insulating film.

Another semiconductor integrated circuit device of the present invention is a semiconductor integrated circuit device including a plurality of nonvolatile memory cells and further includes: a semiconductor substrate having a surface including a first surface region at a first level, a second surface region at a second level lower than the first level, and a step side region linking the first surface region and the second surface region together; and a driver circuit, formed on the semiconductor substrate, for driving the plurality of nonvolatile memory cells. Each of the nonvolatile memory cells is a nonvolatile semiconductor memory device including: a channel region formed in the first surface region of the semiconductor substrate; a source region and a drain region which are formed in the surface of the semiconductor substrate so as to interpose the channel region therebetween; a first insulating film formed on the surface of the semiconductor substrate; a floating gate formed on the first insulating film; and a control gate which is capacitively coupled to the floating gate via a second insulating film. The control gate is formed on the first insulating film. The drain region includes a low-concentration impurity layer which is formed in the second surface region, covers a corner portion between the second surface region and the step side region and reaches the first surface region, and a high-concentration impurity layer which is connected to the low-concentration impurity layer and which is formed in a region distant from the channel region. An impurity concentration of the low-concentration impurity layer is lower than an impurity concentration of the high-concentration impurity layer. The floating gate covers the step side region and at least a part of the low-concentration impurity layer via the first insulating film.

BRIEF DESCRIPTION OF THE DRAWINGS

FIG. 4 is a graph showing the impurity concentration profiles obtained by calculator simulations for the nonvolatile semiconductor memory device of the present invention.

FIGS. 17A to 17D are views showing planar layouts of the opening of a mask for forming a concave portion.

DESCRIPTION OF THE PREFERRED EMBODIMENTS

Hereinafter, embodiments of the present invention will be described with reference to the accompanying drawings.
(First Embodiment)

Figure 1A:
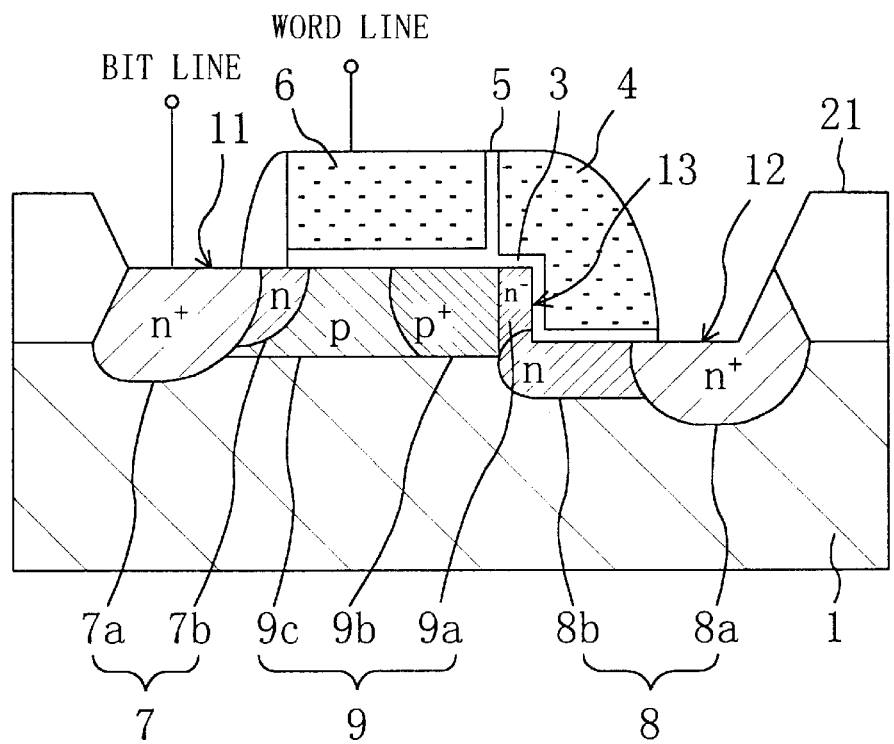
FIG. 1A is a cross-sectional view of the first embodiment of the nonvolatile semiconductor memory device according to the present invention.
Figure 1B:
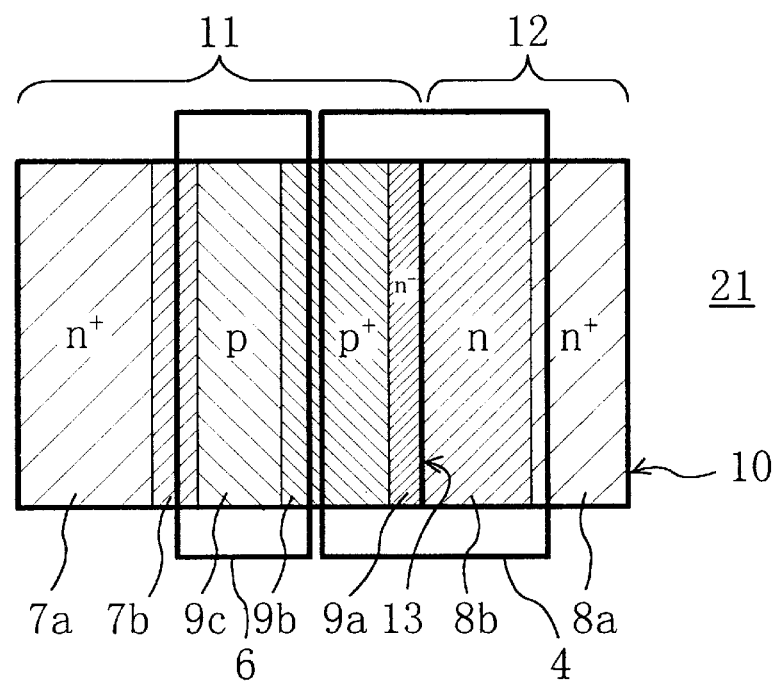
FIG. 1B is a view showing a planar layout thereof.

FIG. 1A shows the cross section of the first embodiment of the nonvolatile semiconductor memory device according to the present invention. FIG. 1B shows a planar layout of the main components thereof. A single nonvolatile memory is illustrated in FIGS. 1A and 1B for the sake of simplicity. However, in actuality, a large number of nonvolatile memories are arranged on one and same substrate.

As shown in FIG. 1A, the nonvolatile semiconductor memory device of this embodiment includes a semiconductor substrate 1 (p-type silicon substrate) with an element isolation layer 21 formed on the surface thereof. In a region (active region) of the surface of the substrate 1 in which region the element isolation layer 21 is not formed, a step is formed. The surface of the substrate 1 is divided by this step into a surface region at a relatively high level (first surface region) 11 and a surface region at a relatively low level (second surface region) 12. The level difference (height of the step) between the first surface region 11 and the second surface region 12 is, for example, in the range from 50 nm to 70 nm. The size of the step is preferably in the range from 20 nm to 150 nm.

In this specification, the first surface region 11 will sometimes be referred to as an "upper part of the step" and the second surface region 12 will sometimes be referred to as a "bottom of the step". Also, the surface region between the first surface region 11 and the second surface region 12 will be referred to as a "step side region" 13.

The first surface region 11 and the second surface region 12 are linked together by the step side region 13. In the cross-sectional view of FIG. 1A, the step side region 13 is shown as a side vertical to the surface of the substrate. Alternatively, the step side region 13 may be constituted by a curved surface or may be formed so as to be inclined with respect to the second surface region 12, as will be described later.

On the surface of the semiconductor substrate 1, a control gate 6 is formed over the first surface region 11 via a first insulating film 3. The first insulating film 3 extends from the first surface region 11 to reach the second surface region 12 by way of the step side region 13. A part of the first insulating film 3, which overlaps the step side region 13, functions as a tunnel oxide film. On the tunnel oxide film 3, a floating gate 4 is formed so as to be adjacent to the control gate 6. The first insulating film 3 is formed to be relatively thin under the floating gate 4 and to be relatively thick under the control gate 6. The floating gate 4 is capacitively coupled to the control gate 6 via a capacitive insulating film 5. The control gate 6 is either connected to a word line or patterned such that the control gate 6 itself functions as a word line. The floating gate 4 has a surface (convex surface) facing the step side region 13 and the second surface region 12 via the tunnel oxide film 3 and a surface (concave surface) facing the step side region 13 and the first surface region 12 via the tunnel oxide film 3.

In the surface of the semiconductor substrate 1, a source region 7 is formed in the first surface region 11, a drain region 8 is formed in the second surface region 12, and a channel region 9 is formed in the first surface region 11 so as to be interposed between the source region 7 and the drain region 8.

Next, the configurations of the source region 7, the drain region 8 and the channel region 9 will be described in more detail.

The drain region 8 includes a high-concentration impurity layer 8a formed in the second surface region 12 and a low-concentration impurity layer 8b formed in the second surface region 12. The low-concentration impurity layer 8b is electrically connected to the high-concentration impurity layer 8a. The high-concentration impurity layer 8a is connected to a wire (not shown). In this specification, the high-concentration impurity layer 8a and the low-concentration impurity layer 8b of the drain region 8 will sometimes be referred to as a "high-concentration drain region" 8a and a "low-concentration drain region" 8b, respectively. The impurity concentration of the low-concentration drain region 8b is lower than the impurity concentration of the high-concentration drain region 8a.

In this embodiment, the low-concentration drain region 8b extends from the high-concentration drain region 8a to a corner portion between the second surface region 12 and the step side region 13 to entirely cover the corner portion, but does not reach the first surface region 11. As a result, in the corner portion between the second surface region 12 and the step side region 13, the convex part of the lower surface of the floating gate 4 faces one end of the low-concentration drain region 8b. The low-concentration drain region 8b also faces the bottom surface of the floating gate 4 via the tunnel oxide film 3.

The source region 7 formed in the first surface region 11 includes a high-concentration impurity layer 7a and a low-concentration impurity layer 7b having an impurity concentration lower than the impurity concentration of the high-concentration impurity layer 7a. The low-concentration impurity layer 7b is provided between the high-concentration impurity layer 7a and the channel region 9, and faces an edge portion of the floating gate 4 via the tunnel oxide film 3. It is noted that, as shown in this figure, the source region 7 is connected to a bit line. In this specification, the high-concentration impurity layer 7a and the low-concentration impurity layer 7b of the source region 7 will sometimes be simply referred to as a "high-concentration source region" 7a and a "low-concentration source region" 7b, respectively.

The channel region 9 includes: a p-type low-concentration impurity layer 9c formed in a region adjacent to the source region 7; an n⁻-type extremely-low-concentration impurity layer 9a which is formed in the step side region 13 and which has the same conductivity type as the conductivity type (n type) of the drain region 8; and a p⁺-type high-concentration impurity layer 9b formed between the n⁻-type low-concentration impurity layer 9a and the p-type low-concentration impurity layer 9c. The impurity concentration in the channel region 9 is asymmetric along the channel direction. In this specification, such a channel will be referred to as a "triple channel". Also, in this specification, the p⁺-type high-concentration impurity layer 9b and the p-type low-concentration impurity layer 9c of the channel region 9 will sometimes be simply referred to as a "high-concentration channel region" 9b and a "low-concentration channel region" 9c, respectively. The n⁻-type extremely-low-concentration impurity layer 9a of the channel region 9 functions as a part of the channel region, not as a part of the drain region. However, the n⁻-type impurity layer 9a will sometimes be referred to as a "drain potential expansion region". This is because a potential in the upper part of the step side region 13 (a part of the channel region) shows a value approximate to the potential in the drain region 8 owing to the existence of the n⁻-type extremely-low-concentration impurity layer 9a. However, the impurity layer is not always required to be of n⁻ type but may be of p⁻ type in order that the step side region and the vicinity thereof function as a "drain potential expansion region".

As shown in FIG. 1B, a rectangular active region 10 is formed so as to be surrounded by the element isolation layer 21. However, it is noted that the shape of the active region 10 is not limited to the illustrated one. As described above, the active region 10 is divided by the step side region 13 into the first surface region 11 and the second surface region 12. The floating gate 4 is disposed so as to overlap the step side region 13 and partially covers both the first surface region 11 and the second surface region 12. The control gate 6 lies over the first surface region 11 and is adjacent to the floating gate 4. In the active region 10, a pair of n-type high-concentration impurity layers (n⁺ layers) are formed in regions which are not covered with the floating gate 4 and the control gate 6 and function as the high-concentration source region 7a and the high-concentration drain region 8a, respectively. Inside the region covered with the floating gate 4 and the control gate 6, the low-concentration drain region 8b, the extremely-low-concentration impurity layer 9a, the high-concentration channel region 9b and the low-concentration channel region 9c are disposed.

As can be seen from FIG. 1B, the floating gate 4 has an isolated pattern and thus is electrically isolated from the floating gates of the other nonvolatile memories (not shown). Though the control gate 6 is provided in a location adjacent to the floating gate 4, the control gate 6 is not always required to have an isolated pattern unlike the floating gate 4, but may be configured so as to be integrated with a word line.

Next, exemplary operations of the device of this embodiment for writing, reading and erasing data will be briefly described.

First, in writing data, a voltage of about 2.5 V is applied to the control gate 6, a voltage of 0 V is applied to the source region 7, and a voltage of about 5 V is applied to the drain region 8. Then, hot electrons are generated in the channel region 9 and are injected into the floating gate 4. The writing of data is performed in this manner.

In reading data, the level relationship between the voltages to be applied to the source region 7 and the drain region 8 is inverted. Specifically, a voltage of 3.3 V is applied to the control gate 6, a voltage of 3.3 V is applied to the source region 7, and a voltage of about 0 V is applied to the drain region 8.

In order to erase data, a voltage of −5 V is applied to the control gate 6 and a voltage of about 7 V is applied to the drain region 8, thereby taking out the electrons accumulated in the floating gate 4 into the drain region 8 via the tunnel oxide film 3. The electrons pass through the tunnel oxide film 3 based on the FN tunneling phenomenon.

The nonvolatile semiconductor memory device shown in FIGS. 1A and 1B is principally characterized in (1) that the channel region 9 has a triple structure consisting of the n⁻-type or p⁻-type extremely-low-concentration impurity layer 9a, the p⁺-type high-concentration impurity layer 9b and the p-type low-concentration impurity layer 9c and (2) that the low-concentration drain region 8b is formed so as to cover the corner portion at the bottom of the step.

Since the device has such features, it is possible to employ a circuit configuration in which the electrons in the floating gate 4 are taken out into the control gate 6 by utilizing the FN tunneling phenomenon and by using the second insulating film as a tunnel oxide film, or a circuit configuration in which the electrons are taken out from the floating gate into the drain layer by utilizing the FN tunneling phenomenon and by using the first insulating film as a tunnel oxide film.

In addition, since the device has the above-described features (1) and (2), the threshold voltage Vt of the floating gate 4 may be set at about 0.0 V to about 0.3 V in order to perform a read operation at a high speed. Moreover, thanks to the above-described feature (1), it is possible to electrically form the "drain potential expansion region" in the end portion of the channel region 9 (i.e., the portion covered with the floating gate 4). As a result, a strong lateral electric field can be generated in the boundary between the inversion channel region, which is immediately under the control gate 6, and the "drain potential expansion region". Consequently, the electron injection efficiency in the step side region 13 can be increased. Furthermore, the above-described feature (2) enhances the effects to be attained by the electrical formation of the "drain potential expansion region".

Since this device has such a drain structure, when a voltage of about 5 V is applied to the drain region 8 in writing data, the n⁻-type extremely-low-concentration impurity layer 9a is depleted. In this case, since the n-type low-concentration drain region 8b has a higher impurity concentration than that of the n⁻-type extremely-low-concentration impurity layer 9a, only a part of the n-type low-concentration drain region 8b (i.e., a part adjacent to the n⁻-type extremely-low-concentration impurity layer 9a) is depleted. As a result, a high electric field is formed in the corner portion between the second surface region 12 and the step side region 13 (in this specification, such a portion will sometimes be simply referred to as a "step bottom corner"). In this case, a voltage almost as high as the voltage applied to the drain region 8 (i.e., a drain voltage) is applied to the floating gate 4. However, since the floating gate 4 has a shape corresponding to the shape of the step bottom corner, the effect of the floating gate 4 weakening the electric field intensity of the drain region 8 is reduced. As a result, in the structure shown in FIG. 1A, a high electric field is formed upon the application of a low drain voltage. This effect is further enhanced if a part of the tunnel oxide film 3 over the step side region 13 is thicker than the other parts thereof. In addition, since the electrons flow while making a detour around the corner portion, the conditions for making the electrons obtain high energy match with the conditions for injecting the electrons into the floating gate 4. As a result, the electron injection efficiency can be remarkably increased in the step bottom corner. If the step bottom corner is constituted by a surface having a relatively large curvature, then the conditions for making the electrons obtain high energy more satisfactorily match with the conditions for injecting the electrons into the floating gate. As a result, the electron injection efficiency is further increased.

When a voltage is applied to the high-concentration drain region 8a, the n⁻-type extremely-low-concentration impurity layer 9a plays a role of heightening the potential in the corner portion in upper part of the step. In addition, when the electrons are taken out from the floating gate 4 into the drain region 8 by utilizing the FN tunneling phenomenon of the tunnel oxide film 3 for erasing data, the n⁻-type extremely-low-concentration impurity layer 9a also plays a role of preventing abrupt band bending and a high electric field from being generated in the vicinity of the surface even when a negative bias is applied to the floating gate 4. As a result, it is possible to suppress a phenomenon that the holes generated in band-to-band tunneling current are injected into the oxide film.

Another feature of the device of this embodiment consists in that the impurity concentration in the channel region 9 is high in the region adjacent to the extremely-low-concentration impurity layer 9a and becomes gradually lower as it is closer to the source region 7. The high-concentration channel region 9b, formed so as to be adjacent to the extremely-low-concentration impurity layer 9a, functions to prevent the electrically formed "drain potential expansion region" from expanding from the step side region 13 to reach the region immediately under the control gate 6. As a result, the intensity of the lateral electric field in the boundary between the inversion channel region located immediately under the control gate 6 and the channel region located immediately under the floating gate 4 is further increased. The increment effect of the electric field intensity is more noticeable as compared with a case of merely splitting the control gate 6 and the floating gate 4 from each other. As a result, the electrons can be injected into the floating gate 4 via the step side region 13 with a higher efficiency. In other words, such a structure can not only cause the injection of the electrons in the step bottom corner, bur also increase the electron injection efficiency in the step side region 13, thereby remarkably increasing the electron injection efficiency as a whole.

Moreover, since the low-concentration drain region 8b faces the floating gate 4 over a wide range, the data erasure of taking the electrons out from the floating gate 4 into the drain region 8 can be performed efficiently. In performing data erasure of such a type, even when a high bias is applied to the drain region 8 and a negative bias is applied to the floating gate 4 in order to erase data, it is possible to suppress the injection of holes into the tunnel oxide film 3. As a result, the data erasure characteristics can be improved.

Next, a method for fabricating the nonvolatile semiconductor memory device will be described with reference to FIGS. 2A through 2D and FIGS. 3A through 3D.

Figure 2A:
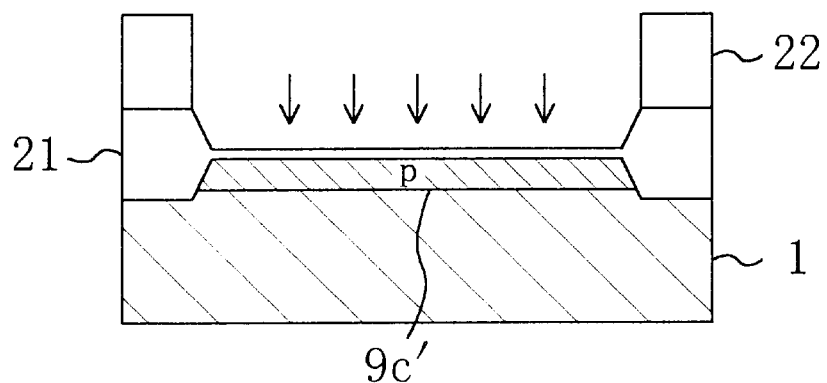
FIGS. 2A to 2D are cross-sectional views showing the respective process steps for fabricating the device of FIG. 1.
Figure 2B:
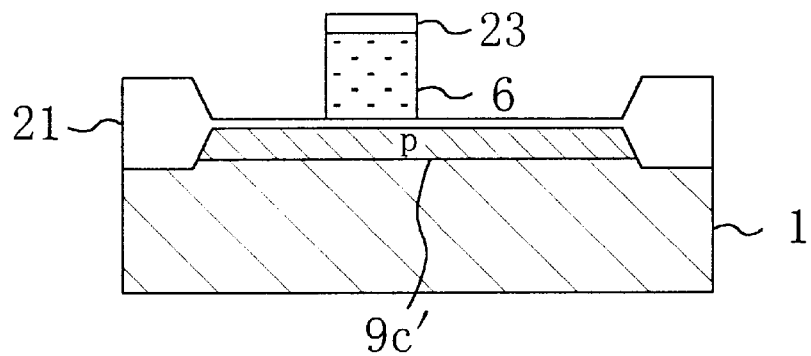

First, as shown in FIG. 2A, an element isolation layer 21 is formed on the surface of a p-type silicon substrate 1. The region of the surface of the substrate 1, where the element isolation layer 21 is not formed, becomes an active region 10. After a protective oxide film is formed over the active region 10 by a thermal oxidization method, the surface of the substrate 1 is covered with a resist mask 22. The resist mask 22 is a mask used when an impurity (p-type impurity) is doped to form the channel region 9 and is patterned so as not to cover the region into which the impurity should be implanted. Thereafter, boron ions (p-type impurity ions) are implanted into the active region 10, functioning as a memory section, under the conditions where the acceleration energy is set at 30 keV and the dose is set at $2.5 \times 10^{12}$ cm$^{-2}$. This ion implantation is performed in order to control a threshold voltage. As a result, a p layer 9c', including the region to be the low-concentration channel region 9c, is formed over the entire surface of the active region 10.

Next, after a gate oxide film having a thickness of 14 nm is formed, a poly-silicon film having a thickness of 330 nm and an HTO (high temperature oxide) film 23 having a thickness of 50 nm are deposited by performing a CVD method or the like. The film 23 may be made of silicon nitride, instead of HTO. Thereafter, these stacked films are patterned by utilizing a known lithography technique and a known etching technique, thereby forming the control gate 6 such as that shown in FIG. 2B.

Figure 2C:
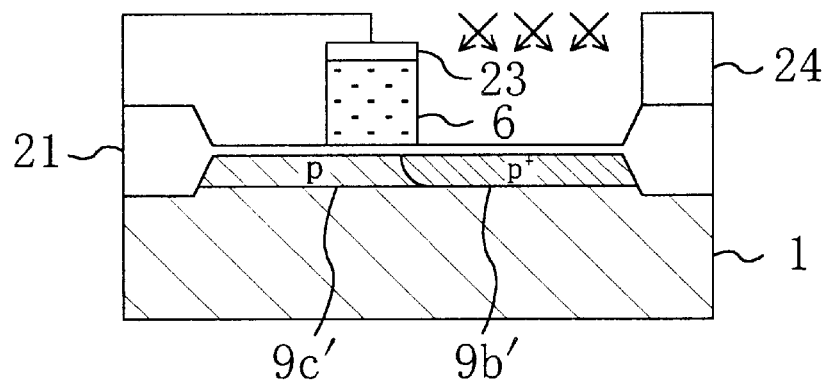

Next, after a resist mask 24 has been formed as shown in FIG. 2C, boron ions are implanted into the active region 10 under the conditions where the acceleration energy is set at 10 keV and the dose is set at $2.00\times10^4$ cm$^2$. In this case, by setting the implantation angle at 20° in accordance with a large-angle-tilt ion implantation technique, the ions are also implanted into the region below the edge of the control gate 6. By performing this ion implantation, a p$^-$ layer 9b' including the region to be the high-concentration channel region 9b is formed as a shallow layer in the surface of the substrate 1.

Figure 2D:
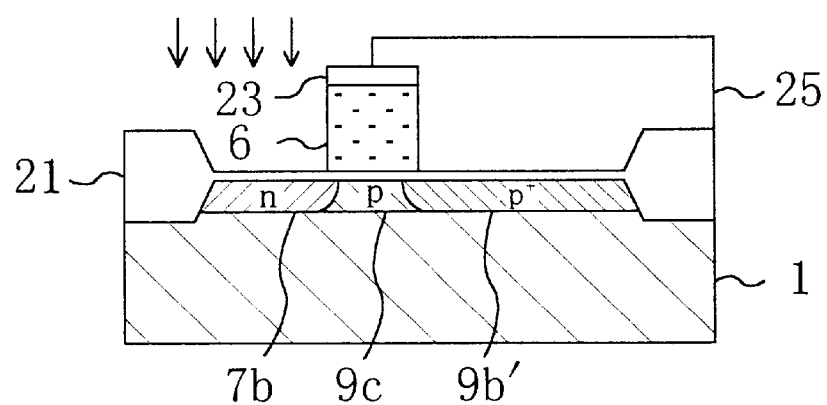
Figure 3A:
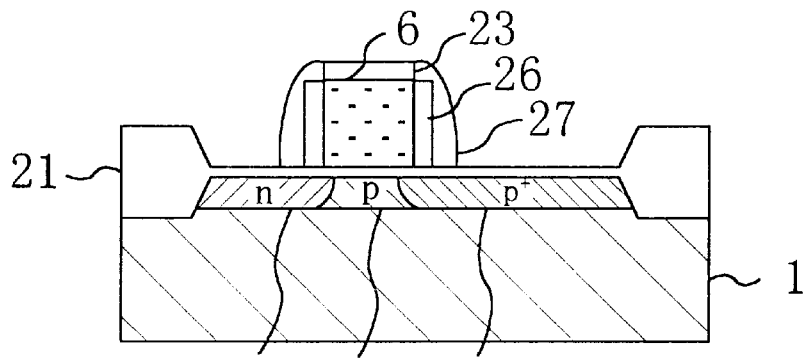
FIGS. 3A to 3D are cross-sectional views showing the respective process steps for fabricating the device of FIG. 1.

Next, as shown in FIG. 2D, after a resist mask 25 has been formed, a low-concentration source region 7b is formed by an ion implantation technique. After the resist mask 25 has been removed, the sides of the control gate 6 are thermally oxidized, thereby forming sidewall oxide films 26 as shown in FIG. 3A. Thereafter, sidewalls 27 of a BPSG film having a thickness of about 50 nm are formed.

Figure 3B:
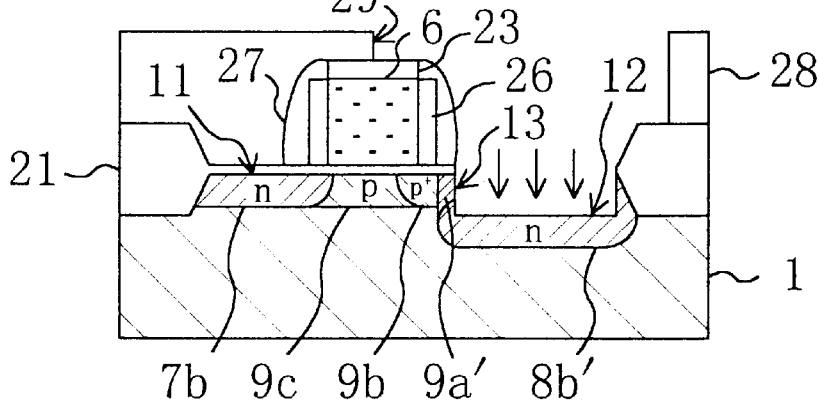

Subsequently, as shown in FIG. 3B, a resist mask 28 having an opening 29 for exposing a part of the active region 10 is formed over the substrate 1. The location and the planar shape of the opening 28 substantially define the location and the planar shape of a concave portion to be formed in the surface of the substrate 1 later. The opening 29 of the resist mask 28 has such a planar shape as that shown in FIG. 16A, for example.

Thereafter, the surface of the substrate 1 is etched by about 50 nm to about 70 nm by using the resist mask 28 as an etching mask, thereby forming the concave portion in the surface of the substrate 1. In this embodiment, by forming the concave portion, a step structure is provided for the surface of the substrate 1. However, the method for forming a step in the active region 10 of the substrate 1 is not limited to this method for forming the concave portion in the active region 10.

Figure 17A:
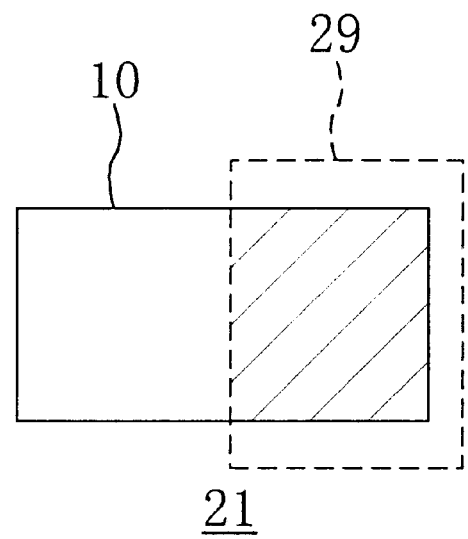
Figure 17B:
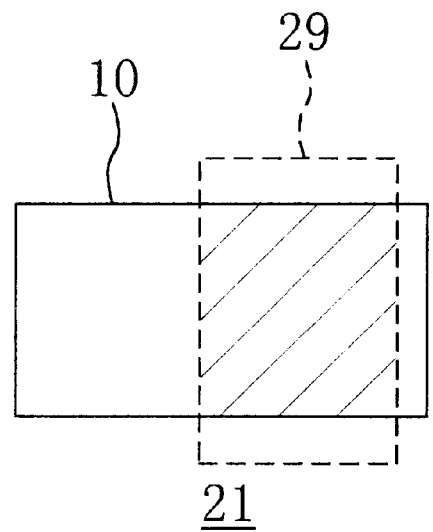
Figure 17C:
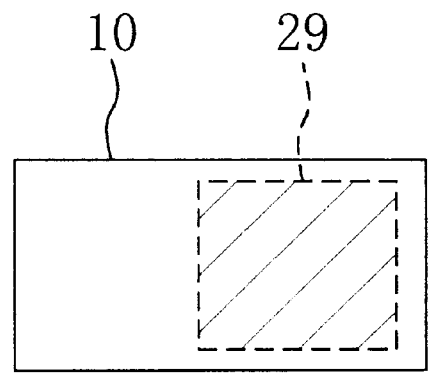

The etching for forming the concave portion in the active region 10 is preferably performed by a method which is less likely to do much damage to the substrate 1 (for example, by a chemical dry etching (CDE) process). In the CDE process, radicals of an etching gas are generated, and silicon is etched by producing a chemical reaction between the exposed surface of the silicon substrate 1 and the radicals. Thus, the CDE does not do damage to the substrate 1. The cross section of the concave portion which has been formed by the CDE process under anisotropic conditions is shown in FIG. 17. FIG. 17 is a view which has been drawn based on a photograph obtained by scanning electron microscopy (SEM). As can be seen from FIG. 17, a concave portion 51 (having a depth of about 50 nm) is formed in the surface of the silicon substrate 1 by performing the CDE process. This CDE process is performed by using a photoresist 50 as a mask. A corner portion 55 between the bottom surface (i.e., the second surface region 53) and a side (i.e., the step side region 54) of the concave portion 51 is constituted by a gently curved surface. Such a curved corner portion 55 plays a role of increasing the efficiency with which the electrons are injected into the floating gate, as described above. In addition, it has been confirmed that a tunnel oxide film (not shown) formed by thermally oxidizing the side 54 and the bottom surface 53 of the concave portion 51 has a satisfactory film quality.

Figure 16A:
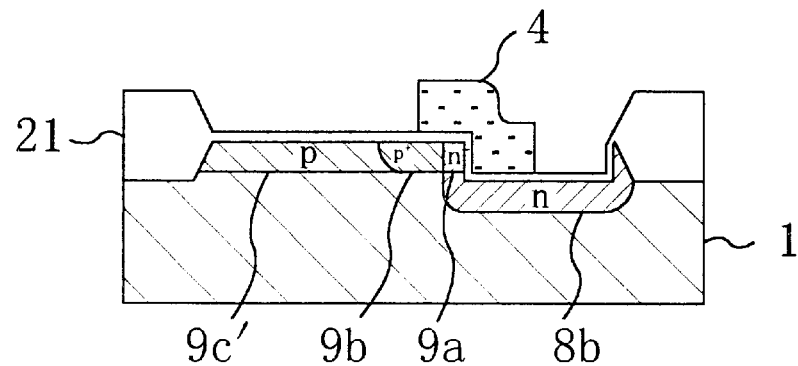
FIGS. 16A to 16C are cross-sectional views showing the respective process steps for fabricating the device of FIG. 14.

FIG. 16A will be referred to again. In the case of performing an etching process for forming a concave portion by using the resist mask 28 having such an opening 29 as that shown in FIG. 16A, a part of the element isolation layer 21 is exposed through the opening 29. However, since the etching process is performed under the conditions defined for selectively etching silicon, the etching of the element isolation layer 21 is negligible. Strictly speaking, the surface of the silicon substrate 1 is etched by using the resist mask 28 and the element isolation layer 21 as a mask during this etching process. In the case shown in FIG. 16A, the hatched region is etched so that a surface (i.e., a bottom surface of the concave portion) having a level lower than that of the other region of the active region 10 comes into being. In the active region 10, the non-etched region becomes the "first surface region 11" and the etched region (hatched region) becomes the "second surface region 12". Of the inner side surfaces of the concave portion which have been formed by performing this etching process, an inner side surface located between the first surface region 11 and the second surface region 12 becomes the "step side region 13" linking these surface regions together. It is noted that the opening 29 of the resist mask 28 is not limited to that having the layout shown in FIG. 16A, but may be one having such a layout as that shown in FIG. 16B or 16C.

Next, as shown in FIG. 3B, an ion implantation of arsenic ions is performed through the opening 29 of the resist mask 28. Specifically, the arsenic ions are implanted into the concave portion of the substrate 1 under the conditions where the dose is set at $6.0\times10^{13}$ cm$^{-2}$ and the acceleration energy is set at a relatively high value of 60 keV. The implantation angle is set at 7°, for example. By performing the arsenic ion implantation in such a manner, the low-concentration drain region 8b is formed under the bottom surface of the concave portion and the n$^-$-type extremely-low-concentration impurity diffusion layer (or p$^-$-type impurity diffusion layer) 9a is formed in the step side region 13. In this ion implantation process, the arsenic ions are implanted into the step side region 13. However, before the implantation of the arsenic ions is performed, the conductivity type of the step side region is p type. Thus, as the amount of the arsenic ions implanted into the step side region 13 increases, the conductivity type of the step side region 13 gradually changes from p$^-$ type into n$^-$ type. However, at any rate, the concentration of the n-type impurity in the step side region 13 is at an insufficient level for the step side region 13 to function as a drain region. Thus, the extremely-low-concentration impurity layer 9a functions as a part of the channel region 9. In this way, a channel region 9 having a triple structure is obtained.

Figure 3C:
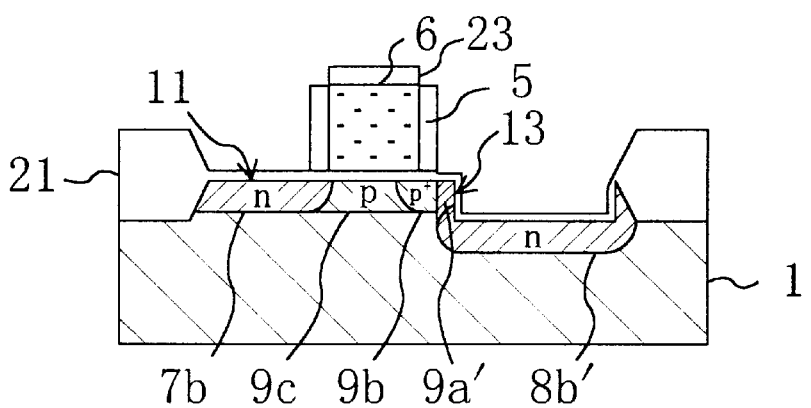

Subsequently, as shown in FIG. 3C, the BPSG sidewalls 27 are removed and the exposed surfaces are cleaned with sulfuric acid. Even if the sidewall oxide films 26 are etched during the removal of the BPSG sidewalls 27, the sidewalls of the control gate 6 are finally covered with a capacitive insulating film 5 because the sidewalls of the control gate 6 are oxidized during the next process step. Next, an oxide film having a thickness of 9 nm is formed by performing a thermal oxidization process. A first insulating film 3 which is thick in the region immediately under the control gate 3 and is thin in the region immediately under the floating gate 4 is formed by performing this thermal oxidization process. As a result of the formation of the first insulating film 3 in such a shape, the channel hot carriers can be injected with a higher efficiency from the source side during writing. Since the oxidization rate of poly-silicon is high during this oxidization process, an oxide film having a thickness of about 15 nm is grown on the sidewalls of the control gate 6.

Figure 3D:
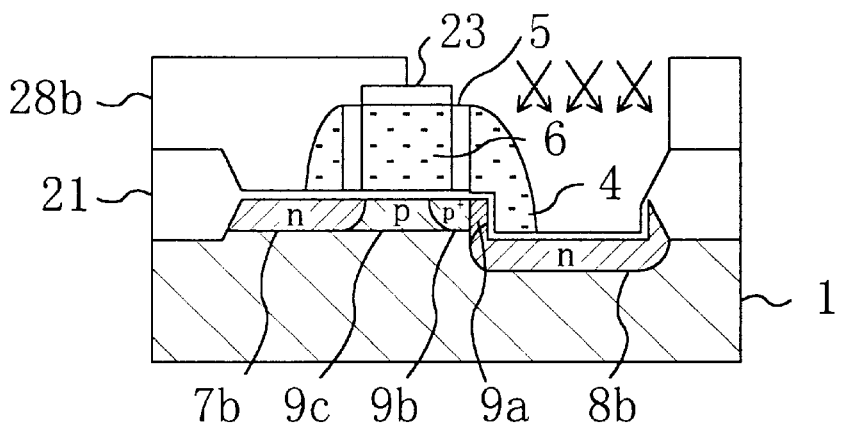

Then, after a poly-silicon film having a thickness of about 150 nm has been deposited, the poly-silicon film is etched in accordance with an anisotropic etching technique, thereby forming a floating gate 4 such that the end face of the floating gate 4 is self-aligned with a side of the control gate 6 as shown in FIG. 3D. Thus, the structure of the present invention easily enables very large-scale integration. Though a poly-silicon film like a sidewall remains on a side of the control gate 6 which is opposite to the side on which the floating gate 4 is formed, the illustration of the polysilicon film is omitted from the drawings such as FIG. 1A because the poly-silicon film does not exert particularly important electrical functions.

After a resist mask 28b has been applied so as to partially cover the control gate 6, phosphorus is implanted under the conditions where the acceleration energy is set at 40 keV and the dose is set at $8.0 \times 10^{14}$ cm$^{-2}$, thereby forming a low-concentration drain region 8b. In this case, the implantation angle is set at 20°. Thereafter, though not shown, a thick high-concentration source region 7a and a thick high-concentration drain region 8a are formed. Furthermore, known fabrication process steps for forming interlevel insulating films and wires are performed, thereby completing the fabrication of the nonvolatile semiconductor memory device of this embodiment.

In accordance with such a fabrication method, a drain region 8 and a channel region 9, each having a desired impurity concentration profile, can be formed by performing a simple process. These effects have been confirmed based on the calculation results obtained by performing calculator simulations for the one-dimensional impurity concentration distribution along the surface of the silicon substrate 1. FIG. 4 shows the impurity concentration distribution in the surface of the substrate ranging over the first surface region 11, the step side region 13 and the second surface region 12. In FIG. 4, the impurity concentrations in the surface of the substrate 1 are plotted with respect to the positions in the surface of the substrate over the area ranging from the source region 7 to the drain region 8. In FIG. 4, the solid line represents the impurity concentration for the case of forming a triple channel region and the dotted line represents the impurity concentration for the case of forming a symmetric channel region. The axis of ordinates represents the values of impurity concentration, and the axis of abscissas represents the distances along the surface which are defined by regarding a particular position in the first surface region 11 as a start point.

As can be understood from FIG. 4, an extremely-low-concentration impurity layer 9a having an impurity concentration lower than $3.0 \times 10^{18}$ cm$^{-3}$ is formed in the step side region 13 including the corner portion between the first surface region 11 and the step side region 13. On the other hand, a low-concentration impurity layer 8b is formed in the second surface region 12 including the corner portion between the step side region 13 and the second surface region 12. Furthermore, a high-concentration impurity layer 8a in which the impurity concentration reaches $1 \times 10^{20}$ cm$^{-1}$ is formed on the right of the low-concentration impurity layer 8b. The gentle impurity profile formed in the bottom of the step can weaken the intensity of the electric field formed between the drain region 8 and the substrate 1 when a high voltage is applied to the drain region 8 for erasing data. Thus, such a profile contributes to improving the data erasure characteristics. In addition, such a profile increases the capacitance coupling between the floating gate 4 and the drain region 8, and advantageously increases the potential difference between the floating gate 4 and the control gate 6 during writing. As a result, the injection efficiency is further increased.

As can be understood from the calculation results represented by the solid line, a high-concentration channel region 9b having a relatively high impurity concentration is formed in the region adjacent to the extremely-low-concentration impurity layer 9a, and the thickness of the extremely-low-concentration impurity layer 9a is as small as about 50 nm or less.

The device characteristics of a nonvolatile semiconductor memory device having such a structure have not heretofore been studied sufficiently. Thus, the fundamental operation characteristics about the intensity of a drain electric field in a drain structure having a step will be first described based on the simulation results.

Figure 5:
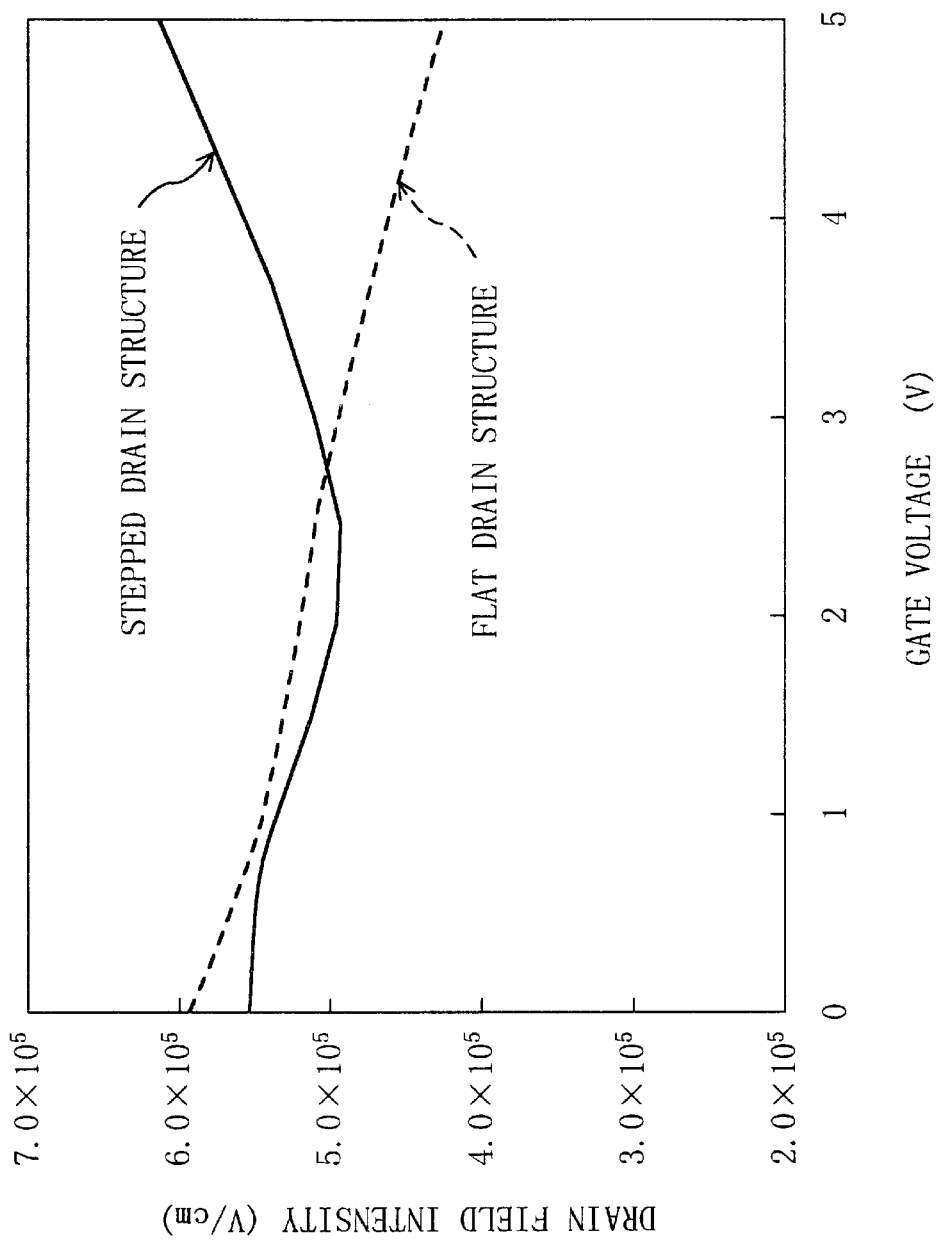
FIG. 5 is a graph showing the gate voltage dependence of the electric field intensity which has been obtained based on the calculator simulations for the nonvolatile semiconductor memory device of the present invention and for a conventional nonvolatile semiconductor memory device having a flat drain structure.

FIG. 5 shows the gate voltage dependence characteristics of the drain electric field intensity which have been obtained based on the calculator simulations for the drain structure of the nonvolatile semiconductor memory device according to the present invention and for a conventional flat drain structure. In this graph, the axis of ordinates represents intensities of electric field and the axis of abscissas represents gate voltages. The solid line represents the calculation result for the drain structure of the present invention and the dotted line represents the calculation result for the conventional flat drain structure. As can be seen, when the drain structure is flat, the intensity of the drain electric field weakens as the gate voltage increases. On the other hand, in the drain structure of the present invention, even when the gate voltage is increased, the intensity of the drain electric field is hardly decreased. In the corner portion between the step side region 13 and the first surface region 11, the floating gate 4 has a shape corresponding to the shape of the corner portion. Thus, it is considered that the drain electric field intensity is not decreased even by the increase of the gate voltage because the effect of the gate voltage weakening the drain electric field intensity is lightened as a result of the correspondence in shape. When the gate voltage is set at a sufficiently high value, the surface potential in the step side region 13 functions so as to suppress the expansion of the drain depletion layer. As a result, the drain electric field intensity is rather increased. As can be understood, in the drain structure employed in the present invention, the gate voltage dependence of the drain electric field intensity is greatly different from a conventional one.

In accordance with this newly found fundamental operation characteristics, even when a voltage approximately as high as a drain voltage is applied to the floating gate 4 in writing data, a high electric field can be formed at a drain voltage lower than a conventional one. In addition, the high electric field is formed in the vicinity of the step bottom corner. This is because the "effect of the floating gate weakening the drain electric field intensity", which is noticeable in a conventional structure, is lightened by the characteristic shape of the floating gate of the present invention.

Figure 6:
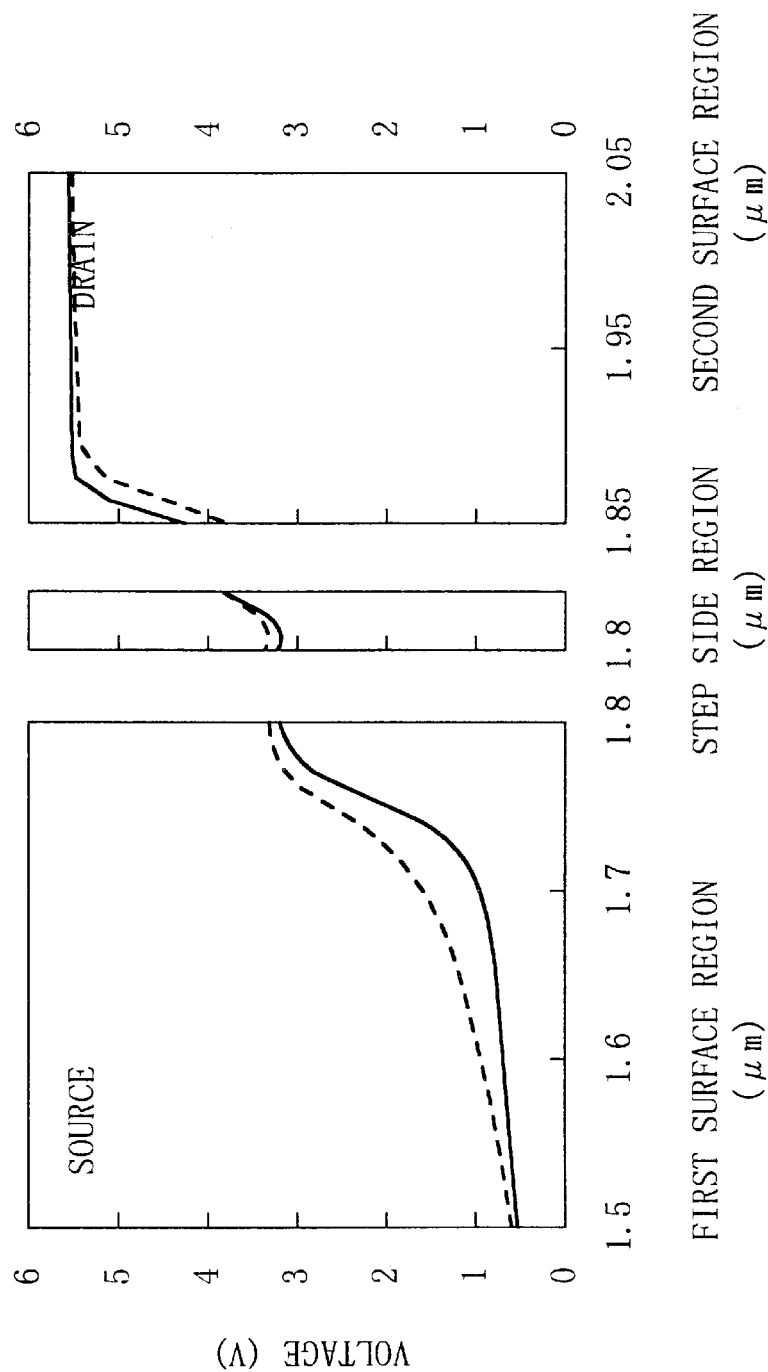
FIG. 6 is a graph showing potential profiles obtained based on calculator simulations for the nonvolatile semiconductor memory device of the present invention.
Figure 7:
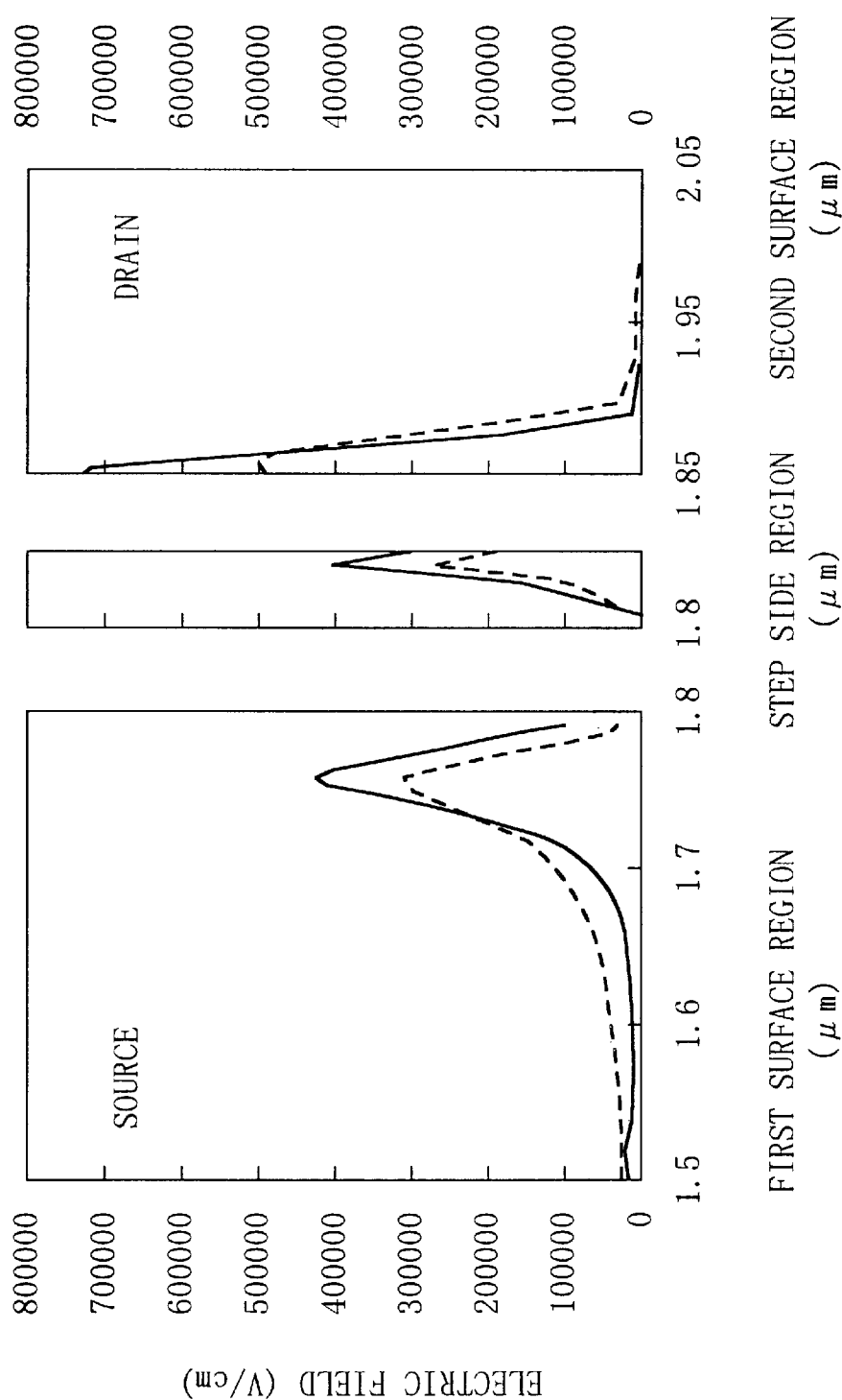
FIG. 7 is a graph showing electric field intensity potential profiles obtained based on calculator simulations for the nonvolatile semiconductor memory device of the present invention.

FIGS. 6 and 7 respectively show the potential distribution and the electric field distribution inside the device for the nonvolatile semiconductor memory device of this embodiment. In both of FIGS. 6 and 7, the calculation results obtained by applying a voltage of 5 V to the drain region and a voltage of 4 V to the floating gate are shown. The distribution of the impurity concentration in the source, drain and channel regions are as shown in FIG. 4. In each of these figures, the solid line represents a case of forming a triple channel region and the dotted line represents a case of forming a symmetric channel region.

When a voltage of 5 V is applied to the drain region, the "drain potential expansion region" is electrically formed in the step side region 13 and the potential is abruptly varied in the corner portion between the step side region 13 and the second surface region 12 (i.e., the step bottom corner) as can be seen from FIG. 6. The potential in the high-concentration drain region 8a is held at a substantially constant value of 5.55 V, which is the sum of the applied voltage and a half (0.55 V) of the band gap of silicon. Moreover, the potential variation in the triple channel region is more abrupt than that in the symmetric channel region.

As can be seen from FIG. 7, a high electric field is generated not only in the first surface region 11 (i.e., the channel region) but also in the bottom part of the step and in the lower part of the step side. This is because the low-concentration drain region 8b has been depleted in the corner portion on the bottom of the step. Moreover, in the case of providing the triple channel region as represented by the solid line, the lateral electric field in the first surface region 11 becomes higher (than the case of providing the symmetric channel region as represented by the dotted line) to become 400,000 V/cm or more. In addition, since the lateral electric field generated in the first surface region 11 is located within the channel region 9, the energy of the electrons in the step side region 13 can be held high, thereby increasing the efficiency with which the electrons are injected into the floating gate 4.

Figure 8:
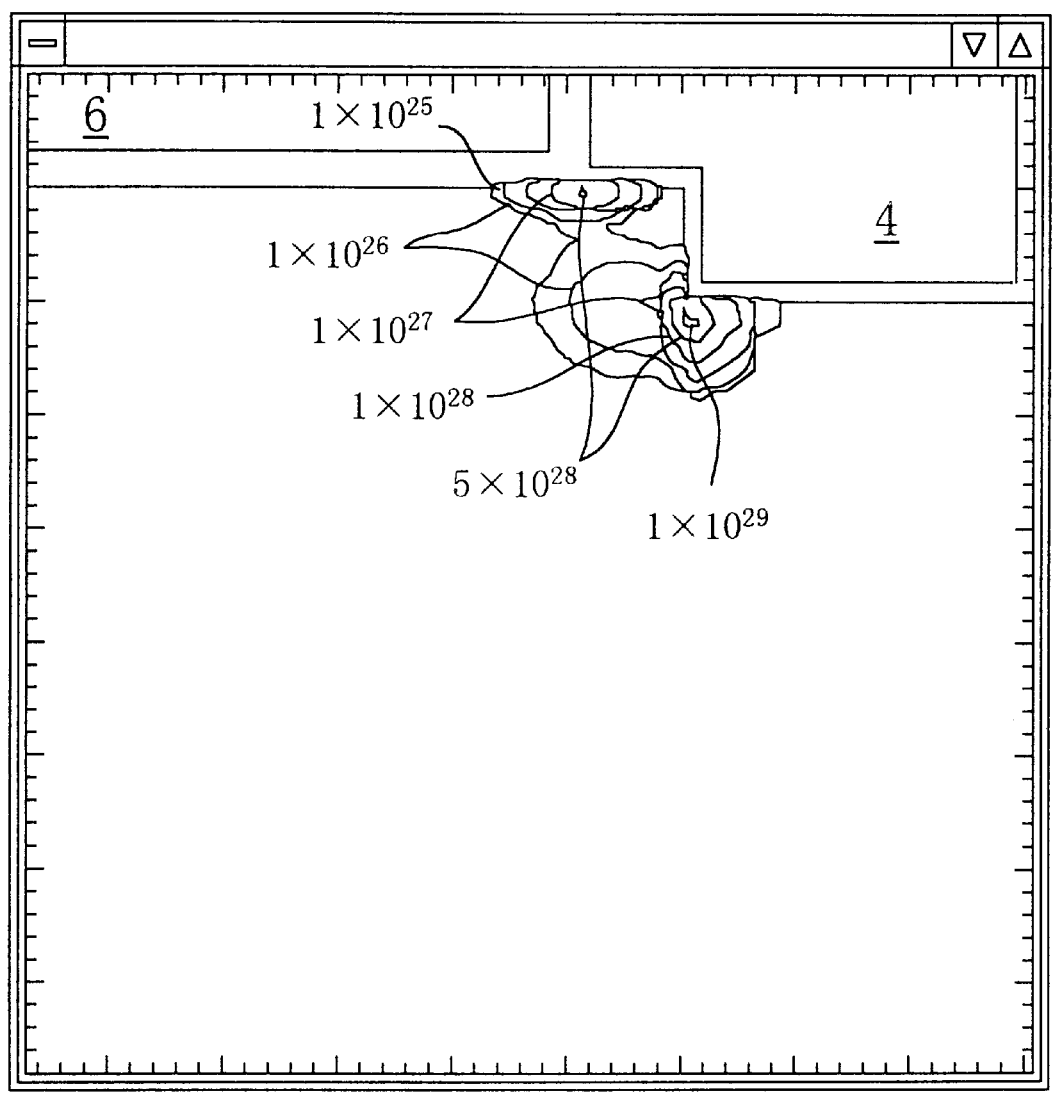
FIG. 8 is a two-dimensional distribution diagram illustrating the generation rates of electron/hole pairs which have been generated by impact ionization.

Such results can also be understood from FIG. 8. FIG. 8 is a two-dimensional distribution diagram of the generation rates of electron/hole pairs which have been generated by impact ionization. As shown in FIG. 8, high impact ionization possibilities are shown in the region immediately under the boundary between the control gate 6 and the floating gate 4 and in the corner portion under the bottom of the step. These results also indicate that there are two points where the electrons are generated with a high efficiency in the nonvolatile semiconductor memory device of the present invention.

Figure 9:
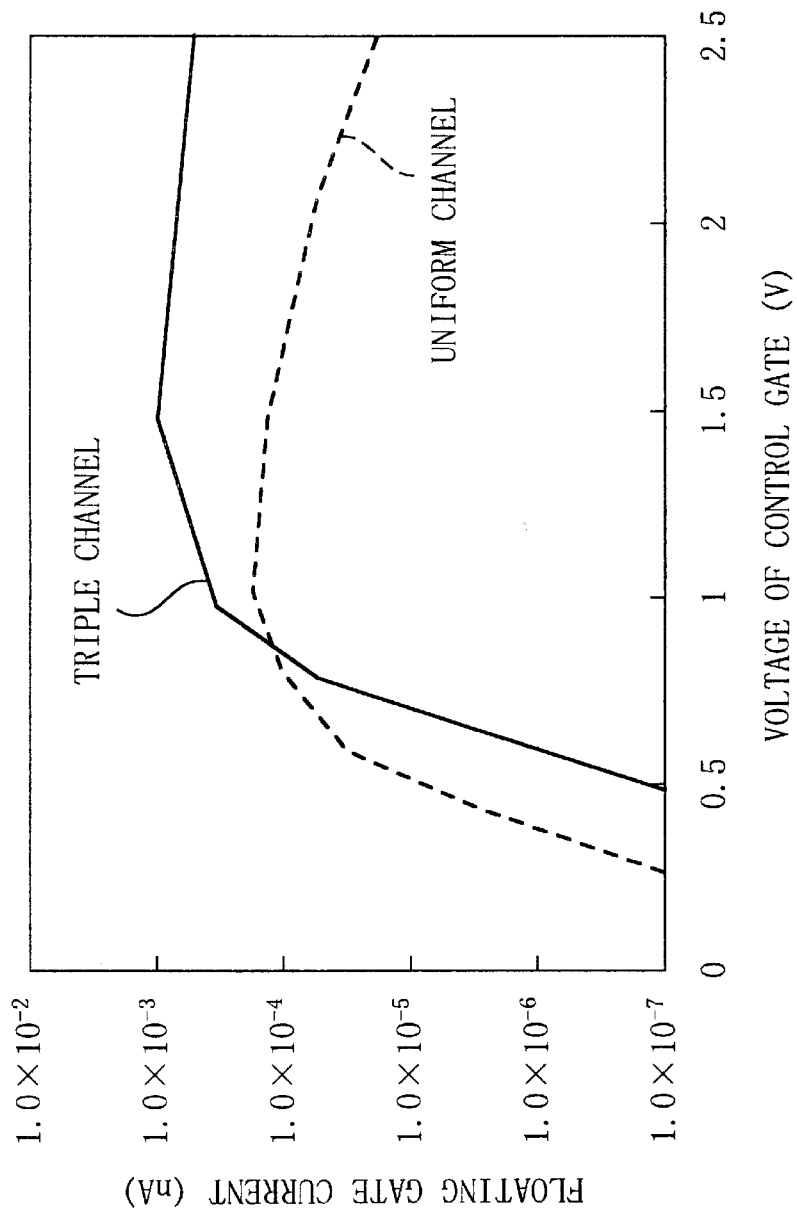
FIG. 9 is a graph showing the control gate voltage dependence of the floating gate current density obtained based on calculator simulations for the nonvolatile semiconductor memory device of the present invention.

FIG. 9 shows the control gate voltage dependence of the gate current for the nonvolatile semiconductor memory device of this embodiment. FIG. 9 shows the calculation results obtained by applying a voltage of 5 V to the drain region. The solid line represents a case of providing a triple channel region and the dotted line represents a case of providing a symmetric channel region. In FIG. 9, the axis of ordinates represents floating gate current values and the axis of abscissas represents the voltages applied to the control gate. Even in the case of providing a symmetric channel region, a higher gate current value can be obtained as compared with a conventional structure. Nevertheless, in the case of providing a triple channel region, the characteristics have further been improved on the order of 10 times as compared with the case of providing a symmetric channel region.

As described above, the structure of the present invention can not only increase the electron injection efficiency in the step side region 13, but also cause the electrons to be injected into the corner portion between the step side region 13 and the second surface region 12 and into the vicinity thereof. As a result, the electron injection efficiency can be considerably increased as a whole. In addition, data erasure characteristics, as well as data write characteristics, can be improved.

Next, various fashions, in which electrons are injected in the nonvolatile semiconductor memory device according to the present invention, will be described with reference to schematic diagrams.

Figure 11A:
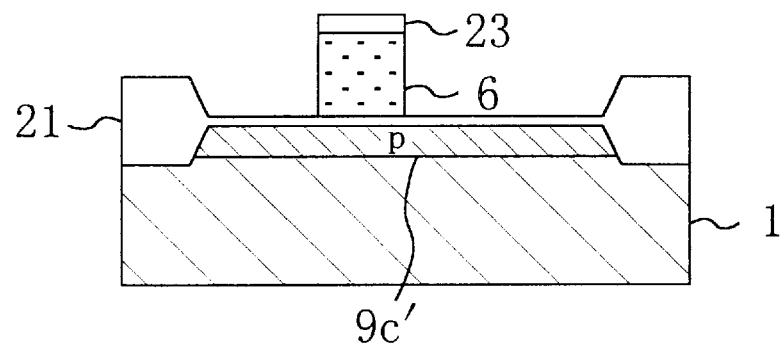
FIGS. 11A to 11C are cross-sectional views showing the respective process steps for fabricating the device of FIG. 10.
Figure 18:
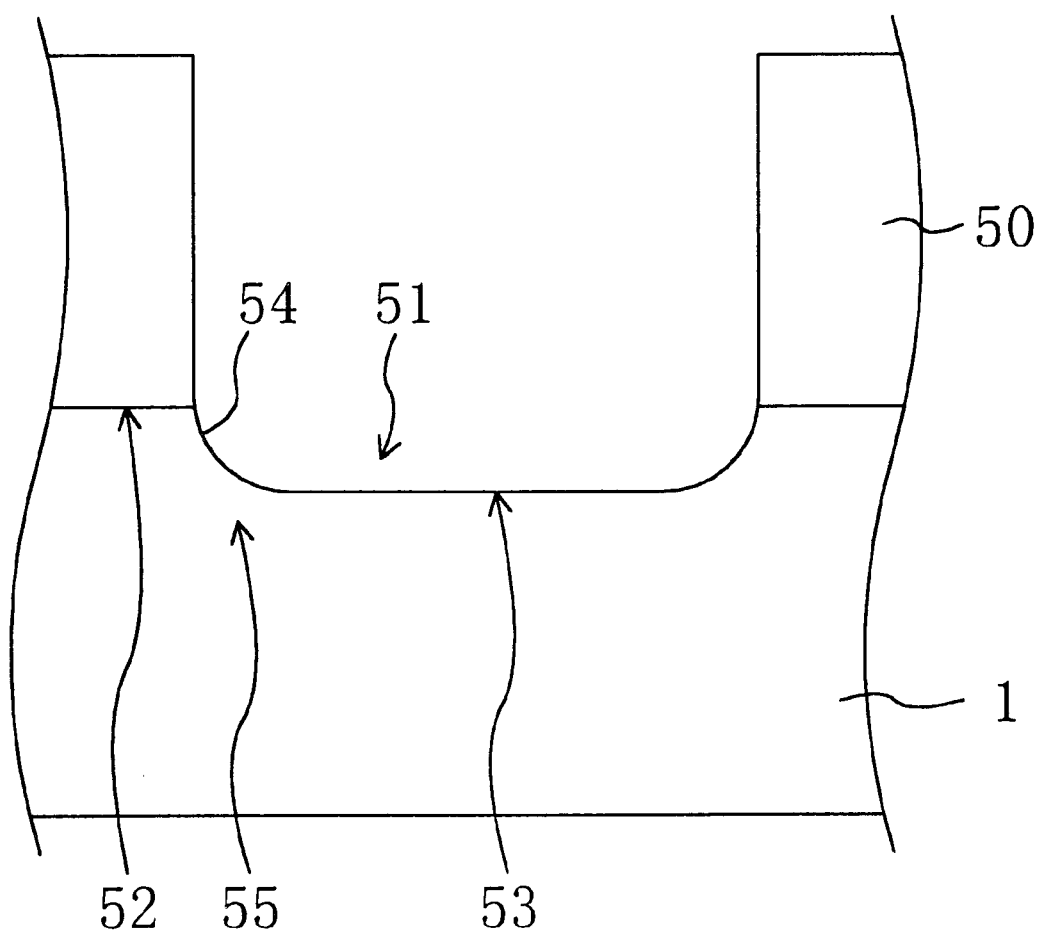
FIG. 18 is a view of a concave portion, formed in the surface of a silicon substrate by a chemical dry etching process, based on a photograph obtained by scanning electron microscopy.

Both of FIGS. 11A and 18B correspond to the embodiment shown in FIG. 1A. In these cases, a considerable amount of electrons are injected into the floating gate 4 not only in the corner portion between the first surface region and the step side region but also in the corner portion between the step side region and the second surface region. More exactly, the electrons are also injected in a part of the second surface region which is closer to the step side region and in the entire step side region.

Figure 19A:
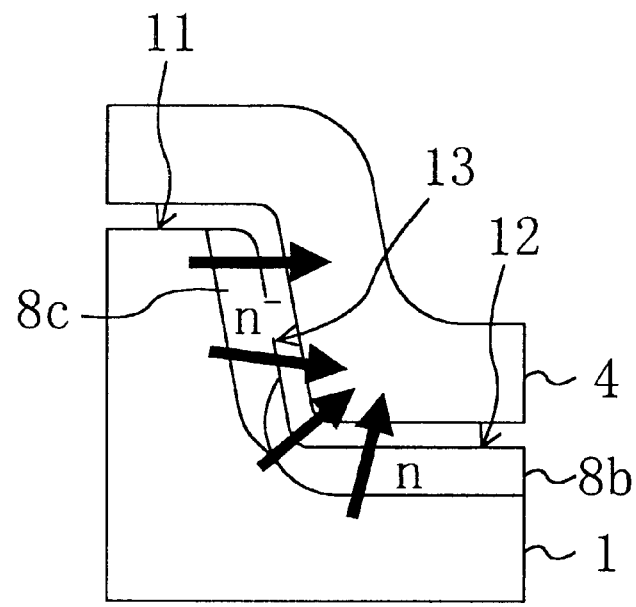
FIGS. 19A and 19B are schematic diagrams showing various fashions in which electrons are injected for the nonvolatile semiconductor memory device of the present invention.
Figure 19B:
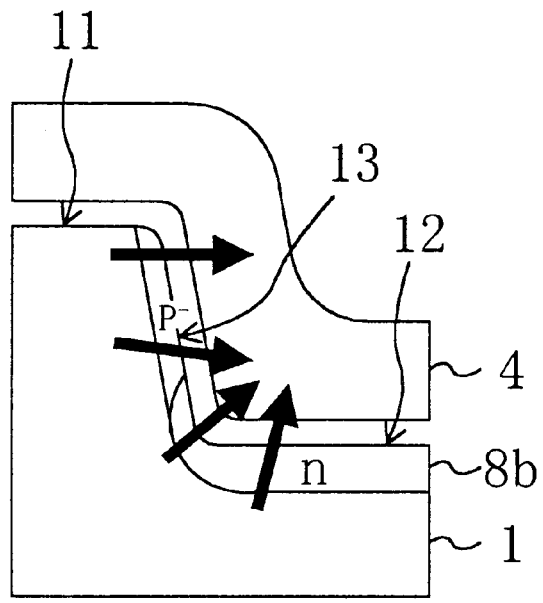
Figure 20A:
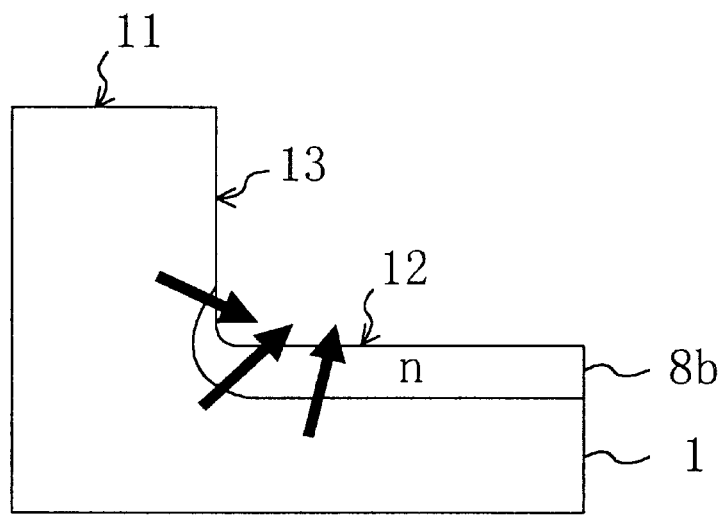
FIGS. 20A and 20B are schematic diagrams showing the relationships between the shape of a step and the electron injection for the nonvolatile semiconductor memory device of the present invention.
Figure 20B:
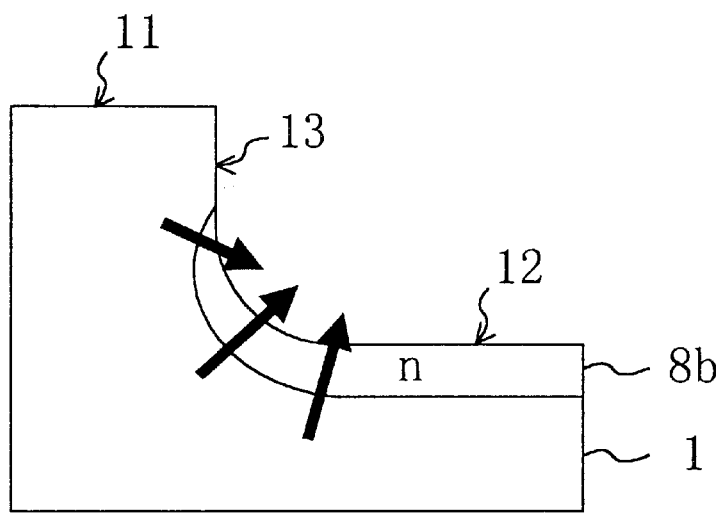

FIG. 19A illustrates a cross section showing a case where the corner portion between the step side region 13 and the second surface region is constituted by a curved surface having a relatively small curvature, and FIG. 19B illustrates a cross section showing a case where the corner portion is constituted by a surface having a relatively large curvature. In the case of FIG. 19B, since the floating gate is located exactly in the directions of the velocity vectors of the injected electrons, the electron injection can be performed with a higher efficiency as compared with the case of FIG. 19A.

(Second Embodiment)

Figure 10:
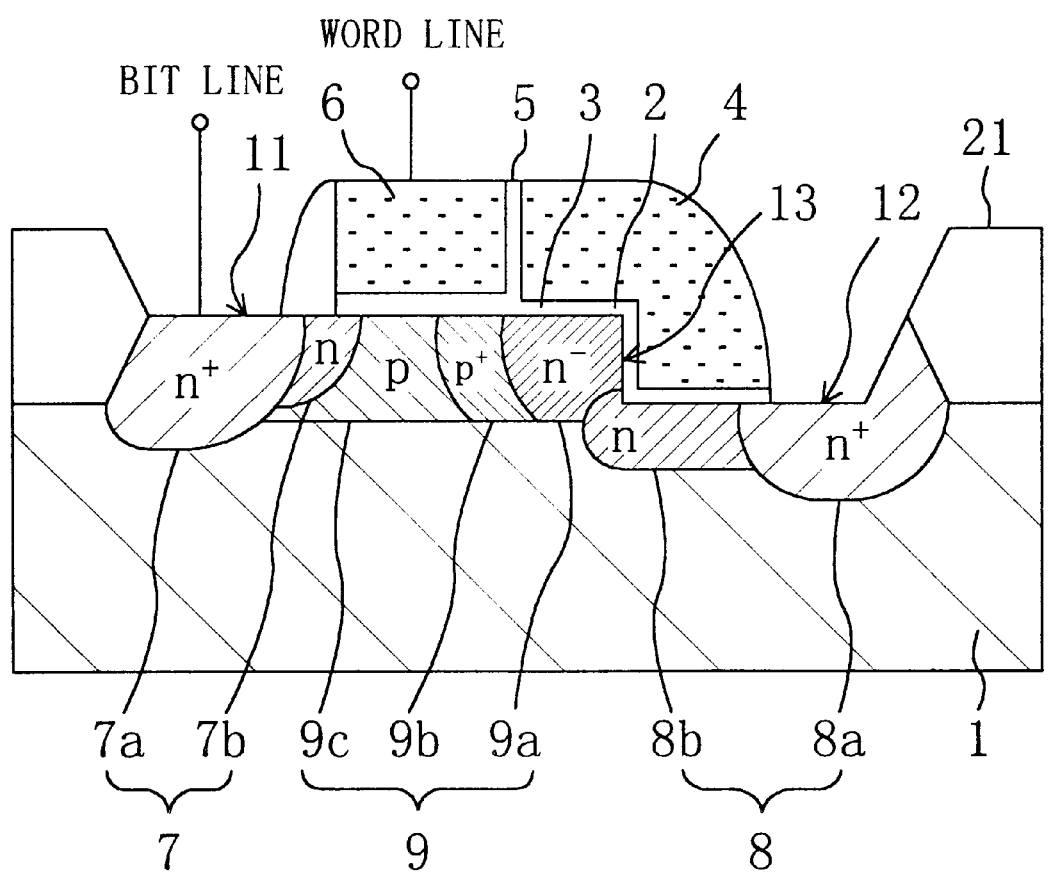
FIG. 10 is a cross-sectional view showing the second embodiment of the nonvolatile semiconductor memory device according to the present invention.

FIG. 10 shows the cross section of the second embodiment of the nonvolatile semiconductor memory device according to the present invention. The device of this embodiment has substantially the same structure as that of the device of the first embodiment, except for the structures of the floating gate 4 and the channel region 7. Thus, the description of the common structures with the first embodiment will be omitted herein and only the points different from those of the first embodiment will be described in detail.

The nonvolatile semiconductor memory device of this embodiment is characterized in that the lateral size of a part of the floating gate 4 overlapping with the first surface region 11 is longer than that in the first embodiment. As a result, the effects can be attained in that, in writing, the variation of the threshold voltage caused by the injection of electrons into the floating gate 4 is increased, thereby facilitating reading. In other words, it is possible to control the threshold under the floating gate 4 more precisely.

It is noted that the same effects as those attained by the first embodiment can be naturally attained in this embodiment, because the majority of the configuration of this embodiment is common with the configuration of the first embodiment.

Next, a method for fabricating the device of this embodiment will be described.

First, FIG. 11A will be referred to. An element isolation layer 21 is formed on the surface of a p-type silicon substrate 1. After a protective oxide film has been formed by a thermal oxidization method over the active region 10, the surface of the substrate 1 is covered with a resist mask (not shown). The resist mask is a mask used when an impurity (p-type impurity) is doped to form the channel region 9 and is patterned so as not to cover the region into which the impurity should be implanted. Thereafter, boron ions (p-type impurity ions) are implanted into the active region 10, functioning as a memory section, under the conditions where the acceleration energy is set at 30 keV and the dose is set at as low as $2.5 \times 10^{12}$ cm$^{-2}$. This ion implantation is performed in order to control a threshold voltage. As a result, a p layer 9c', including the region to be the low-concentration channel region 9c, is formed over the entire surface of the active region 10. Next, after a gate oxide film having a thickness of 14 nm has been formed, a poly-silicon film having a thickness of 330 nm and an HTO film 23 having a thickness of 50 nm are deposited by performing a CVD method or the like. Thereafter, these stacked films are patterned by utilizing a known lithography technique and a known etching technique, thereby forming a control gate 6 such as that shown in FIG. 11A.

Figure 11B:
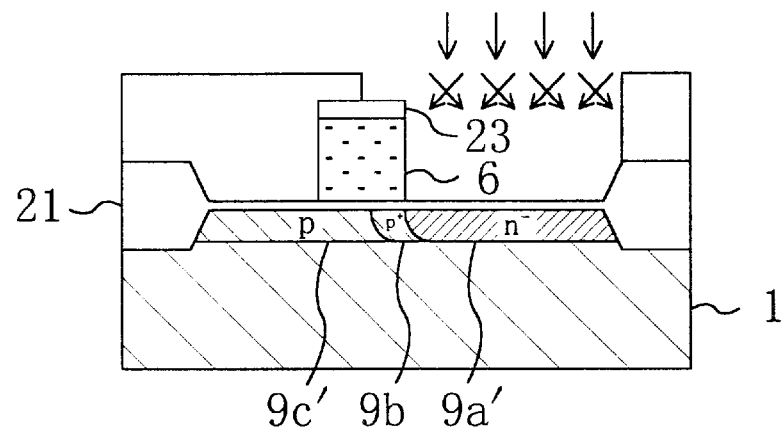

Next, after the region, in which the source region 7 is to be formed, has been covered with such a resist mask as that shown in FIG. 11B, boron ions are implanted into the exposed area of the active region 10 under the conditions where the acceleration energy is set at 10 keV and the dose is set at $4.0 \times 10^{13}$ cm$^{-2}$. In this case, by setting the implantation angle at 20° in accordance with a large-angle-tilt ion implantation technique, the ions are also implanted into the region below the edge of the control gate 6. In addition, arsenic ions are also implanted into the active region 10 under the conditions where the acceleration energy is set at 10 keV and the dose is set at $2.0 \times 10^{12}$ cm$^{-2}$. The implantation angle of the arsenic ions is set at 7°. By performing these ion implantation process steps, a high-concentration channel region 9b and an n$^-$-type extremely-low-concentration impurity layer 9a' are formed in the surface of the substrate 1. As a result, the formation of a channel region 9 having a triple structure is completed. In this manner, a threshold voltage in the range from about 0.1 V to about 0.3 V can be stably set before the step is formed.

The properties of the n$^-$-type extremely-low-concentration impurity layer 9a' can be controlled by adjusting the relationship between the dose of the boron ions and the dose of the arsenic ions which are implanted into the step side region 13. If the concentration of the p-type impurity becomes slightly higher than that of the n-type impurity in the step side region 13 by adjusting the dose of the boron ions and the dose of the arsenic ions, then the extremely-low-concentration impurity layer 9a' becomes a p$^-$ layer.

Figure 11C:
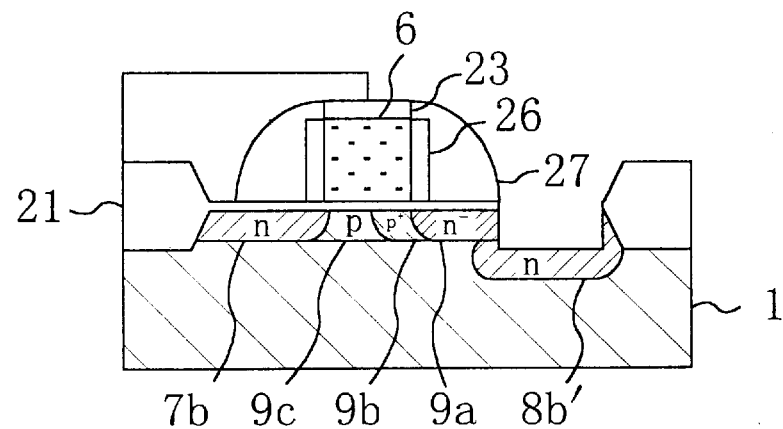

Next, after a resist mask (not shown) having an opening in the region, where the source region is to be formed, has been formed, a low-concentration source region 7b is formed by an ion implantation technique. After the resist mask has been removed, the sidewalls of the control gate 6 are thermally oxidized, thereby forming sidewall oxide films 26 and forming sidewalls 27 of a BPSG film having a thickness of about 50 nm to about 200 nm. Thereafter, as shown in FIG. 11C, a resist mask having an opening is formed over the substrate 1. The location and the planar shape of the opening substantially define the location and the planar shape of the concave portion to be formed in the surface of the substrate 1 later. The opening of the resist mask has such a planar shape as those shown in FIGS. 16A to 16C, for example.

Thereafter, the surface of the substrate 1 is etched by about 50 nm to about 70 nm by using the resist mask shown in FIG. 11C as an etching mask, thereby forming a concave portion in the surface of the substrate 1. Next, arsenic ions are implanted through the opening of the resist mask. Specifically, the arsenic ions are implanted into the concave portion of the substrate 1 under the conditions where the dose is set at $6.0 \times 10^{13}$ cm$^{-2}$ and the acceleration energy is set at a relatively high value of 60 keV. The implantation angle is set at 7°, for example. By performing the arsenic ion implantation in such a manner, the low-concentration drain region 8b is formed under the bottom surface of the concave portion and an n$^-$-type extremely-low-concentration impurity diffusion layer (or p$^-$-type impurity diffusion layer) 9a is formed in the step side region 13. In this way, a channel region 9 having a triple structure is obtained. Thereafter, a tunnel oxide film 3, a floating gate 4, etc. are formed by performing the same method as that described for the first embodiment, thereby obtaining the device of FIG. 10.

As described above, in this embodiment, an n$^-$-type extremely-low-concentration impurity layer (or p$^-$-type impurity diffusion layer) 9a is formed in the surface of the active region 10 before the BPSG sidewalls 27 are formed. Thus, if the thickness of the BPSG sidewalls 27 is increased, then the lateral size of the extremely-low-concentration impurity layer 9a can also be increased as shown in FIG. 11C. In such a case, a relatively long extremely-low-concentration impurity layer 9a can be formed with satisfactory control along the channel length direction as compared with the case of forming the extremely-low-concentration impurity layer 9a after the BPSG sidewalls 27 and the concave portion have been formed as shown in FIG. 3B.

(Third Embodiment)

Figure 12A:
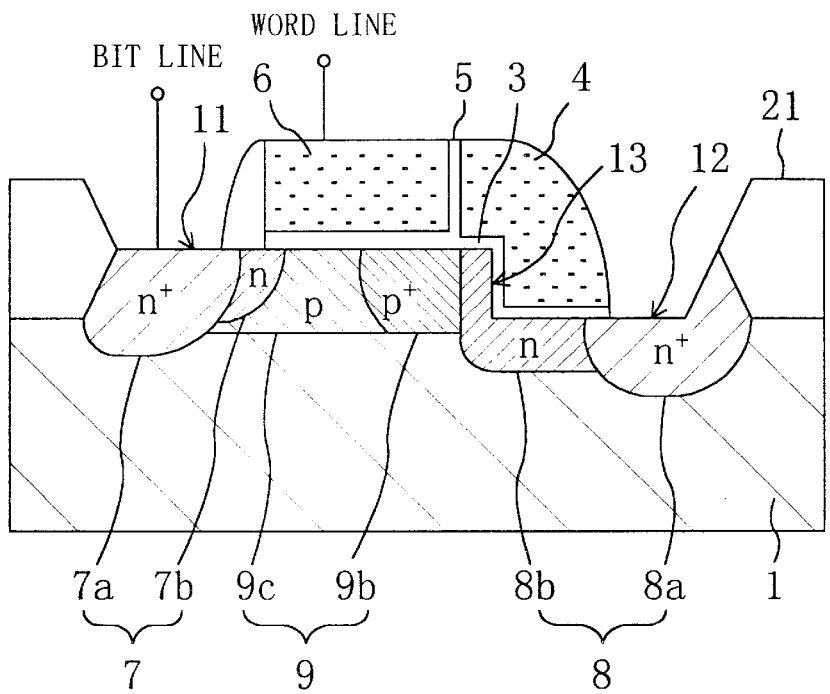
FIG. 12A is a cross-sectional view showing the third embodiment of the nonvolatile semiconductor memory device according to the present invention and FIG. 12B is a cross-sectional view of a modified example thereof.

FIG. 12A shows the cross section of the third embodiment of the nonvolatile semiconductor memory device according to the present invention. The device of this embodiment has the same structure as that of the device of the first embodiment, except for the structures of the channel region 9 and the drain region 8. Thus, the description of the common structures with the first embodiment will be omitted herein and only the points different from those of the first embodiment will be described in detail.

The drain region 8 of this embodiment includes a high-concentration drain region 8a formed in the second surface region 12 and a low-concentration drain region 8b formed in the second surface region 12 and in the step side region 13. The top end of the low-concentration drain region 8b reaches the first surface region 11. The channel region 9 formed in the first surface region 11 includes a low-concentration impurity layer 9c and a high-concentration impurity layer 9b having an impurity concentration higher than the impurity concentration of the low-concentration impurity layer 9c. The high-concentration channel region 9b is in contact with the top end of the low-concentration drain region 8b. If the impurity concentration in a part of the drain region 8, which has been formed along the step side region 13 and the second surface region 12, is symmetrically decreased, then a circuit configuration in which electrons are taken out into the drain region by utilizing the FN tunneling phenomenon can be formed. However, since a large voltage drop is caused in the part of the drain region 8 with a reduced impurity concentration, the drain potential in the corner portion between the first surface region 11 and the step side region 13 also drops. As a result, the intensity of the horizontal electric field between the drain region 8 and the channel region 9 is decreased, and thus the electron injection efficiency in the step side region 13 is decreased. In this embodiment, by providing an asymmetric channel, the decrease of the electron injection efficiency in the step side region 13 can be suppressed.

Figure 12B:
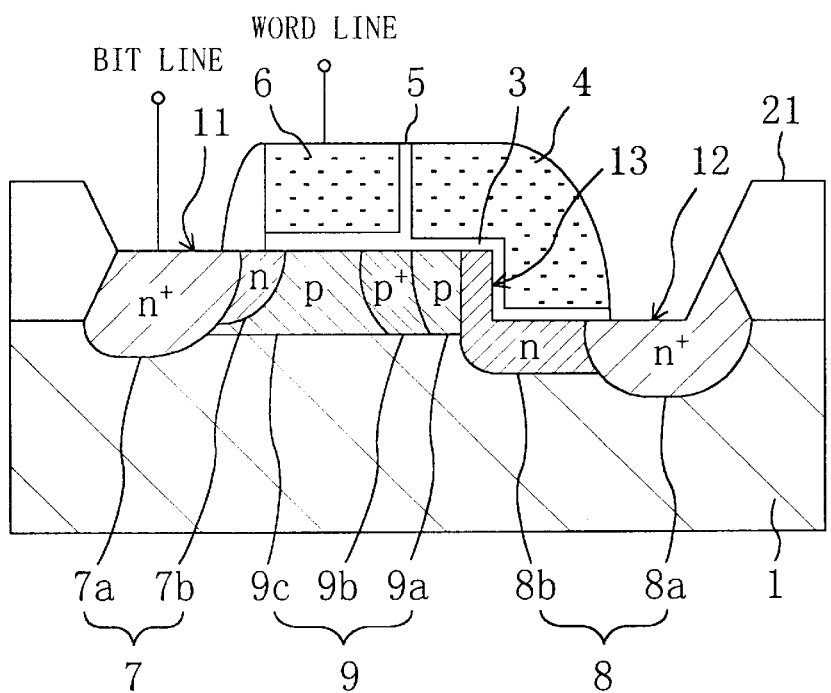

FIG. 12B shows a modified example of the device of FIG. 12A. The device of FIG. 12B resembles the second embodiment. The low-concentration drain region 8b in the device of FIG. 12B also extends from the high-concentration drain region 8a to cover the second surface region 12 and the step side region 13 and reaches the first surface region 11. The channel region 9 formed in the first surface region 11 includes: a low-concentration impurity layer 9c; a high-concentration impurity layer 9b having an impurity concentration higher than the impurity concentration of the low-concentration impurity layer 9c; and another low-concentration impurity layer 9a which has an impurity concentration lower than the impurity concentration of the high-concentration impurity layer 9b and which is provided in a region adjacent to the low-concentration drain region 8b. The threshold voltage in the region under the floating gate 4 is set at about 0.0 V to about 0.3 V by the p-type low-concentration impurity layer 9a. The conductivity type of the low-concentration impurity layer 9a is not always required to be p type depending upon the set value of the threshold voltage, but may be n$^-$ type. If the conductivity type of the low-concentration impurity layer 9a is n⁻ type, then the structure of the channel region of this device becomes the same as the structure of the channel region in the device of FIG. 10.

In the device of FIG. 12B, in writing data, a voltage approximately equal to "a threshold voltage+0.5 V" is applied to the control gate 6, a voltage of 0 V is applied to the source region 7 and a voltage of about 4 to about 5 V is applied to the drain region 8. As a result, the hot electrons, which have been generated in the channel horizontally formed along the first surface region 11, are injected from the channel region 9 into the floating gate 4 along the movement directions thereof. At this time, a high electron injection efficiency is realized thanks to the features of the device of FIG. 12B.

One feature thereof consists in that the coupling capacitance between the drain region 8 and the floating gate 4 is increased because the drain region 8 is formed so as to cover the step side region 13 and the second surface region 12. Thus, in writing data, the potential of the floating gate 4 can be increased by the drain region 8 having a high potential, the potential difference between the floating gate 4 and the control gate 6 can be increased, and the intensity of the horizontal electric field generated in the boundary between the "inversion channel region" which is immediately under the control gate 6 and the "drain potential expansion region" which is formed immediately under the floating gate can be increased.

Another feature thereof to prevent the "drain potential expansion region" from extending to reach the region immediately under the control gate 6 by providing the high-concentration channel region 9b. As a result, the intensity of the horizontal electric field and the electron injection efficiency can be further increased.

(Fourth Embodiment)

Figure 13A:
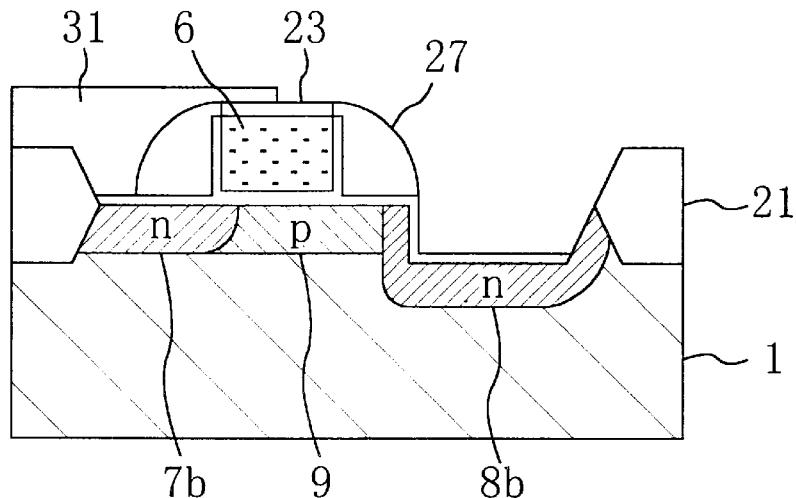
FIGS. 13A, 13B and 13C are cross-sectional views of the fourth embodiment of the nonvolatile semiconductor memory device according to the present invention during the respective fabrication process steps thereof.

The fourth embodiment of the nonvolatile semiconductor memory device according to the present invention will be described with reference to FIGS. 13A to 13C.

The device of this embodiment has a similar structure to that of the device of the third embodiment, except for the structures of the floating gate 4 and a contact structure 35. Thus, the description of the common structures with the third embodiment will be omitted herein and only the points different from those of the third embodiment will be described in detail. The device of this embodiment includes a high-concentration drain region 8a formed in the second surface region 12 and a low-concentration drain region 8b formed in the second surface region 12 and the step side region 13, as shown in FIG. 13C. The high-concentration drain region 8b is in electrical contact with a contact structure (conductive member) 35. The bottom surface of the contact structure 35 faces the floating gate 4 via an insulating film 32, which has been formed so as to entirely cover the upper surface of the floating gate 4.

The floating gate 4 is surrounded by the drain region 8 and the contact structure 35. Since the potential in the contact structure 35 is equal to the potential in the drain region 8, the coupling capacitance between the drain region 8 and the floating gate 4 is remarkably increased by the contact structure 35. If a material having a high relative dielectric constant such as silicon nitride or tantalum oxide is selected for the insulating film 32, then the coupling capacitance between the drain region 8 and the floating gate 4 can be further increased.

As can be seen, in this embodiment, since the contact structure 35, overlapping the floating gate 4, increases the coupling capacitance between the drain region 8 and the floating gate 4, the potential in the floating gate 4 can be held high by the potential in the drain region 8. Thus, the electron injection efficiency can be further increased. As a result, even if the potential in the drain region 8 is lowered as compared with the other embodiments, a required electron injection efficiency can be secured.

It is noted that, if the channel region 9 has the same structure as the structure of the channel region shown in FIG. 12B, then the electron injection efficiency can be further increased.

Next, the main process steps of a method for fabricating this device will be described. First, by performing substantially the same process steps as the process steps of the fabrication method described for the second embodiment, a structure such as that shown in FIG. 13A is produced. After the insulating sidewalls 27 have been removed, the floating gate 4 is formed. Thereafter, by performing an ion implantation, a high-concentration source region 7a and the high-concentration drain region 8a are formed.

Figure 13B:
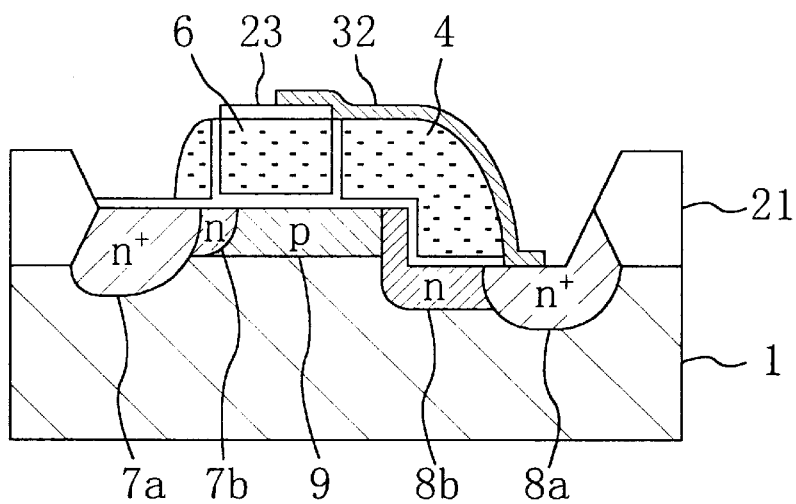

After an insulating film made of a material such as silicon nitride has been deposited so as to cover the entire surface of the substrate 1, the insulating film is patterned, thereby forming the insulating film 32 entirely covering the floating gate 4 as shown in FIG. 13B. In FIG. 13B, the majority of the upper surface of the drain region 8a is illustrated as being covered with the insulating film 32. However, in actuality, a region for contact having a sufficiently large area is secured on the upper surface of the drain region 8a.

Figure 13C:
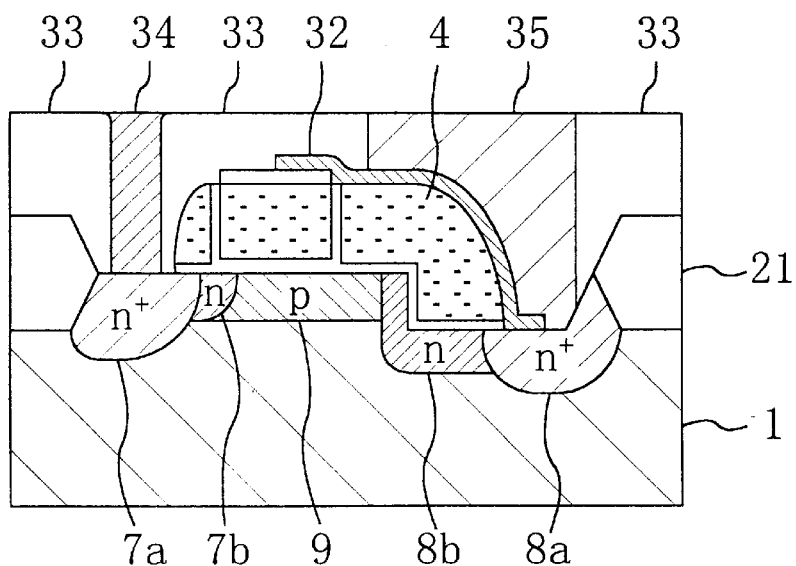

Next, as shown in FIG. 13C, after an interlevel insulating film 33 has been deposited so as to cover the entire surface of the substrate 1, contact holes, respectively reaching the high-concentration source region 7a and the high-concentration drain region 8a, are opened. When these contact holes are opened, the insulating film 32 functions to prevent the floating gate 4 from being etched. Thus, the contact hole on the drain side overlaps the floating gate 4, considering the planar layout thereof. The thickness of the insulating film 32 is preferably small (e.g., on the order of several tens nm) if the coupling capacitance between the floating gate 4 and the contact structure 35 is to be increased. However, if the insulating film 32 is to function as an etch stopper when the contact holes are opened, then the insulating film 32 is required to have a certain thickness. The "certain thickness" is determined by such a factor as an etch selectivity between the insulating film 32 and the interlevel insulating film 33.

Next, the contact holes are filled with a conductive material, thereby forming a contact structure 34 on the source side and the contact structure 35 on the drain side. The conductive material is preferably filled by depositing the conductive material and then by flattening the upper surfaces of the interlevel insulating film 33 and the contact structures 34 and 35 by a chemical and mechanical polishing (CMP) method.

(Fifth Embodiment)

Figure 14:
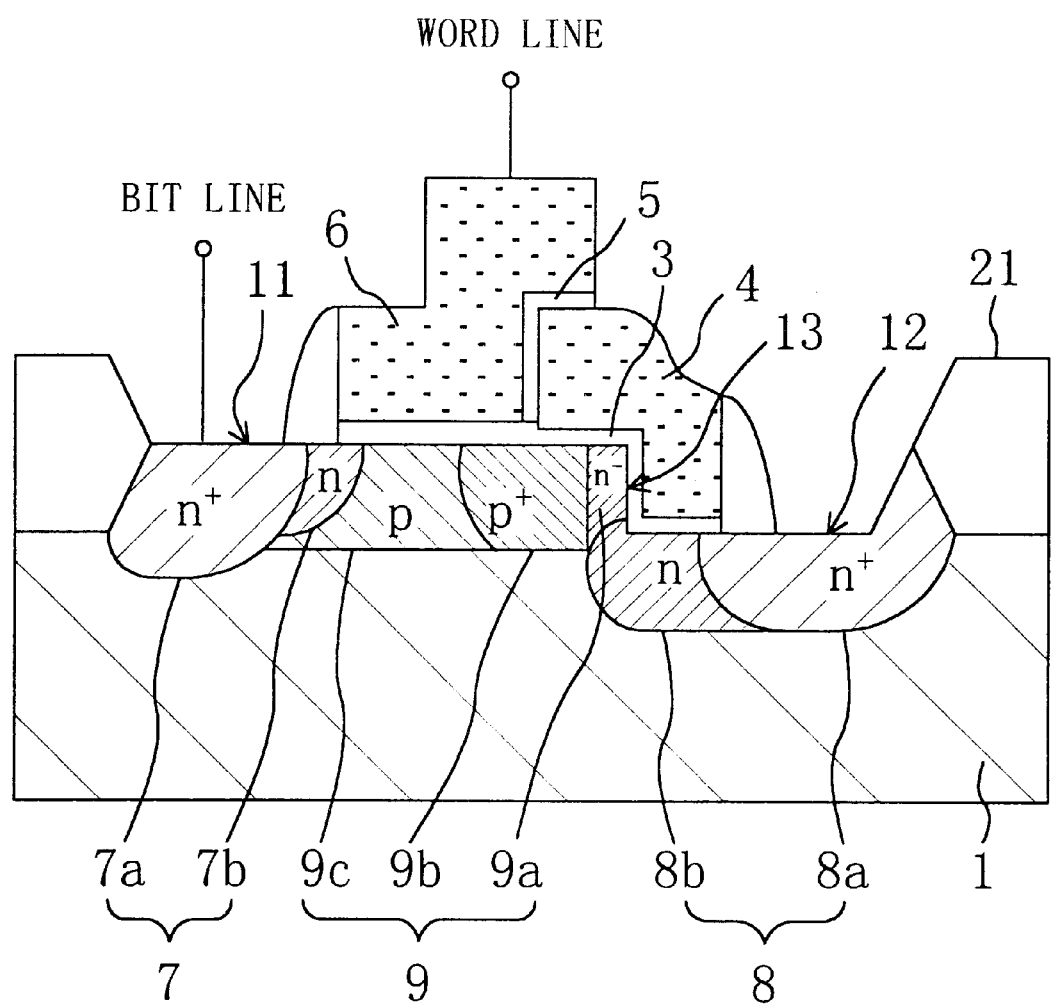
FIG. 14 is a cross-sectional view showing the fifth embodiment of the nonvolatile semiconductor memory device according to the present invention.

Still another embodiment of the present invention will be described with reference to FIG. 14.

The device of this embodiment has substantially the same structure as that of the device of the first embodiment, except for the structures of the floating gate 4 and the control gate 6. Thus, the description of the common structures with the first embodiment will be omitted herein and only the points different from those of the first embodiment will be described in detail.

The floating gate 4 faces not only the step side region 13 but also a part of the first surface region 11 and a part of the second surface region 12 via the first insulating film 3. The control gate 6 includes a part facing the first surface region 11 via the first insulating film 3 and a part which extends from the former part toward the upper part of the floating gate 4 and which faces a side and an upper surface of the floating gate 4 via a capacitive insulating film 5. Such a structure can also attain the same effects as those attained by the device of the first embodiment.

Next, a method for fabricating the nonvolatile semiconductor memory device of FIG. 13 will be described with reference to FIGS. 15A through 15 and FIGS. 16A through 16C.

Figure 15A:
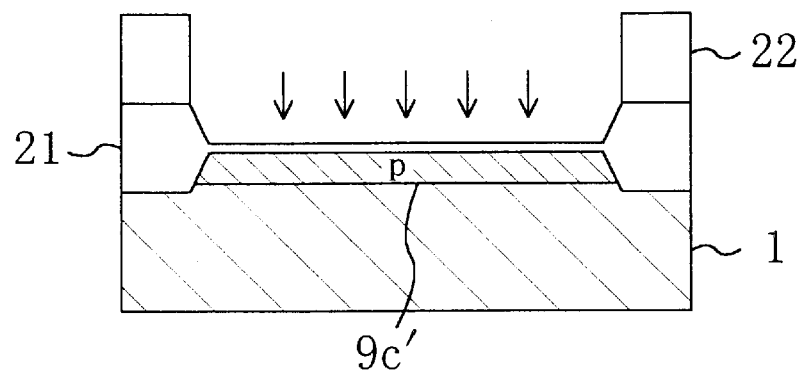
FIGS. 15A to 15C are cross-sectional views showing the respective process steps for fabricating the device of FIG. 14.

First, as shown in FIG. 15A, an element isolation layer 21 is formed on the surface of a p-type silicon substrate 1. The region of the surface of the substrate 1, where the element isolation layer 21 is not formed, becomes an active region 10. After a protective oxide film has been formed over the active region 10 by a thermal oxidization method, the surface of the substrate 1 is covered with a resist mask 22. The resist mask 22 is a mask used when an impurity (p-type impurity) is doped to form the channel region 9 and is patterned so as not to cover the region into which the impurity should be implanted. Thereafter, boron ions (p-type impurity ions) are implanted into the active region 10, functioning as a memory section, under the conditions where the acceleration energy is set at 30 keV and the dose is set at $2.5 \times 10^{12}$ cm$^{-2}$. This ion implantation is performed in order to control a threshold voltage. As a result, a p layer 9c', including the region to be the low-concentration channel region 9c, is formed over the entire surface of the active region 10.

Figure 15B:
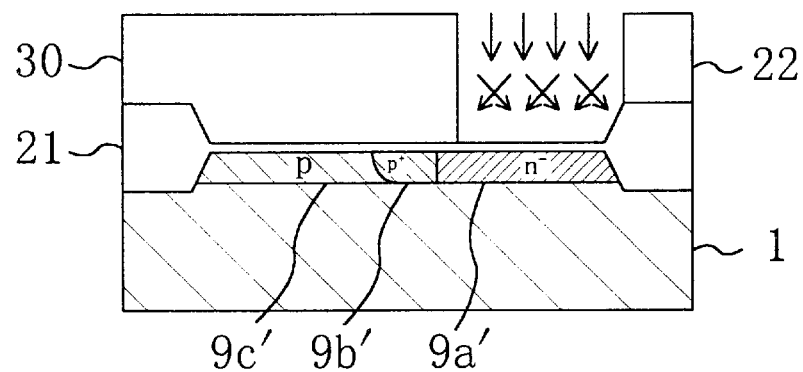
Figure 15C:
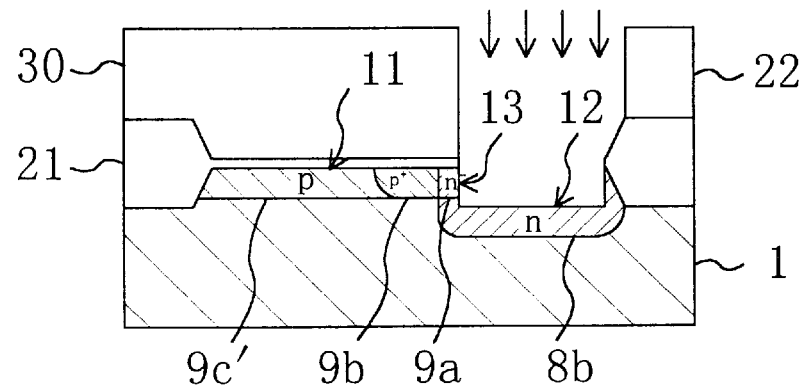

Next, as shown in FIG. 15B, after a resist mask 30 has been formed, boron ions are implanted into the active region 10 under the conditions where the acceleration energy is set at 10 keV and the dose is set at $4.0 \times > 10^{13}$ $cm-2$. In this case, by setting the implantation angle at 20° in accordance with a large-angle-tilt ion implantation technique, the ions are implanted into the region below the edge of the resist mask 30. By performing this ion implantation, a p$^+$ layer 9b', including the region to be the high-concentration channel region 9b, is formed as a shallow layer in the surface of the substrate 1. Next, arsenic ions are implanted into the active region 10 under the conditions where the acceleration energy is set at 10 keV and the dose is set at $2.0 \times 10 \times 12$ cm$^{-2}$. In this case, by setting the implantation angle at 7 degrees, the arsenic ions are prevented from being implanted into the region below the edge of the resist mask 30. As a result, the p layer 9c', the p$^+$ layer 9b' and a part of an n$^-$ layer 9a' exist in the region under the resist mask 30. In other words, a channel region having a triple structure, in which a low-concentration part, a high-concentration part and another low-concentration part are disposed over the region ranging from the end of the source region toward the step side region, is formed. Moreover, a threshold voltage from about 0.1 V to about 0.3 V can be set stably before the step is formed. It is noted that the conductivity type of the n$^-$ layer 9a' having an extremely low concentration is determined by the compensation between boron and arsenic. Thus, by adjusting the implantation dose of boron and the implantation dose of arsenic, the region can be a p$^-$ layer having a low concentration.

Thereafter, the surface of the substrate 1 is etched by about 50 nm to about 70 nm by using the resist mask 30 as an etching mask, thereby forming a concave portion in the surface of the substrate 1. The etching for forming the concave portion in the active region 10 is preferably performed by a method which is less likely to do much damage to the substrate 1 (for example, by a CDE process).

Next, as shown in FIG. 14C, an implantation of arsenic ions is performed through the opening of the resist mask 30. Specifically, the arsenic ions are implanted into the concave portion of the substrate 1 under the conditions where the dose is set at $6.0 \times 10^{13}$ cm$^{-2}$ and the acceleration energy is set at a relatively high value of 60 keV. The implantation angle is set at 7°, for example. By performing the arsenic ion implantation in such a manner, the low-concentration drain region 8b is formed under the bottom surface of the concave portion.

Subsequently, as shown in FIG. 16A, the resist mask 30 is removed and then the exposed surfaces are cleaned with sulfuric acid. After an oxide film 3 having a thickness of 9 nm has been formed on the surface of silicon by performing a thermal oxidization process, a poly-silicon film is deposited thereon. Subsequently, the poly-silicon is patterned in accordance with a lithography technique and an etching technique, thereby forming a floating gate 4.

Figure 16B:
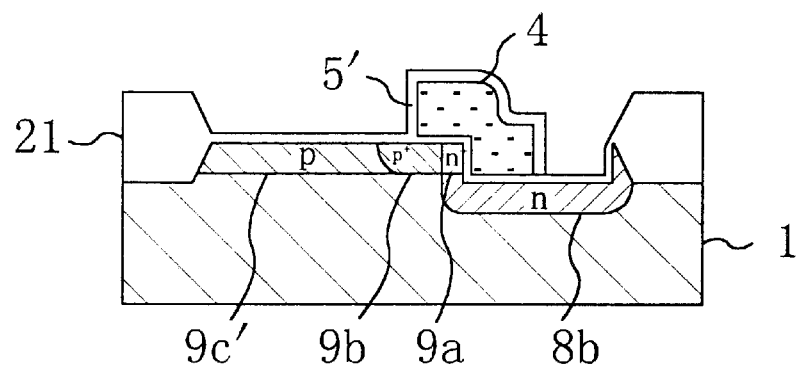
Figure 16C:
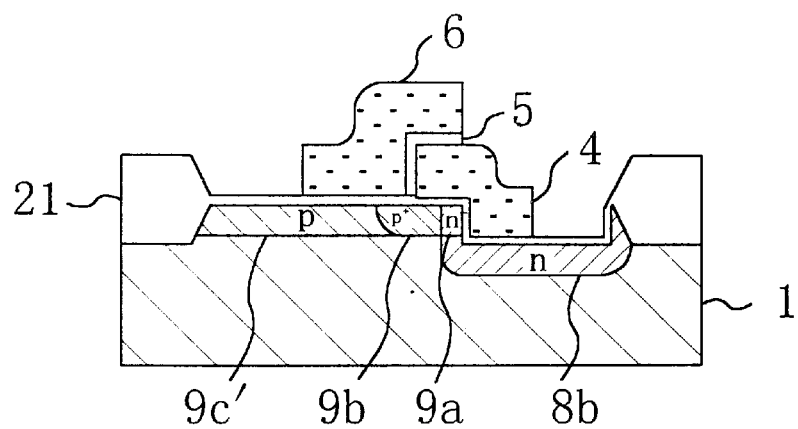

Next, as shown in FIG. 16B, a gate oxide film having a thickness of about 14 nm is formed on the exposed part of the first surface region 11 and a second insulating film (capacitive insulating film) 5' is formed over the floating gate 4 by a thermal oxidization process or by a process in which thermal oxidization and a CVD-TEOS film are simultaneously used. As a result, the first insulating film 3 comes to have a structure which is relatively thin in the region immediately under the floating gate 4 and is relatively thick in the other regions. Thereafter, as shown in FIG. 16C, the control gate 6 is formed by depositing a poly-silicon film having a thickness of 330 nm and then by patterning the poly-silicon film in accordance with a lithography technique and an etching technique. Then, though not shown, a low-concentration source region 7b, insulating sidewalls, etc. are formed and then a high-concentration source region 7a and a high-concentration drain region 8a are formed. In this case, it is not always necessary to implant phosphorus into the low-concentration drain region 8b after the floating gate has been formed.

In any of the foregoing embodiments, the majority of the concave portion formed in the active region 10 is located in the drain region 8, in which only the second surface region having a level lower than that of the first surface region is formed. However, a surface region having the same level as that of the first surface region (i.e., a third surface region) may be formed in the drain region 8. For example, the floating gate 4 and the control gate 6 may entirely cover the concave portion, and the high-concentration impurity layer 8a of the drain region 8 may be formed outside of the concave portion (in the third surface region). Moreover, the high-concentration impurity layer 8a of the drain region 8 may also be formed so as to extend from the inside of the concave portion to the outside thereof (to the third surface region).

Figure 21A:
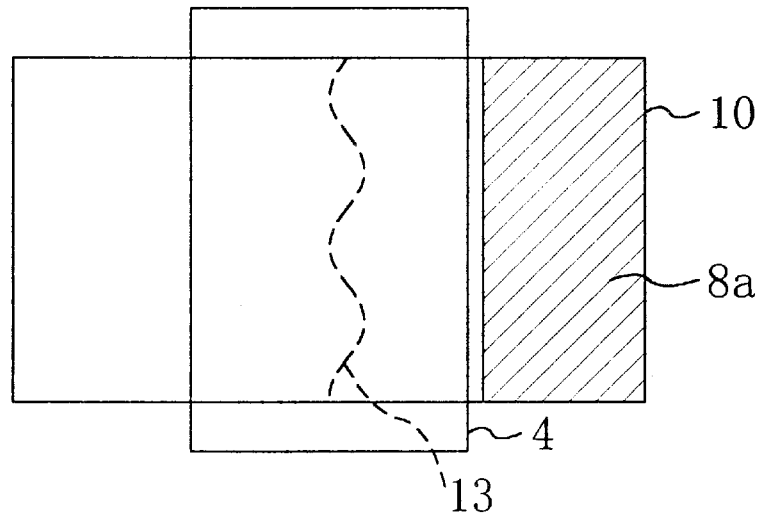
FIGS. 21A and 21B are cross-sectional views showing modified examples of the nonvolatile semiconductor memory device of the present invention.
Figure 21B:
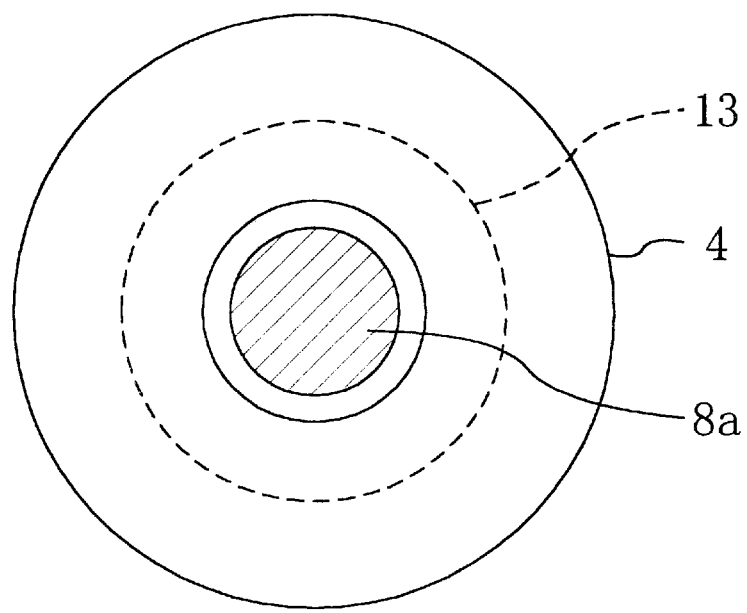

It is noted that, in considering a planar layout, the step side region 13 is not always required to be linear, but may be winding as shown in FIG. 21A. Alternatively, as shown in FIG. 21B, the step side region 13 may be formed so as to surround a circular drain region (high-concentration impurity 8a) and a ring-shaped floating gate 4 may be used. In such a case, since the drain region 8 of each cell is isolated from the source region via the ring-shaped channel region, a single source region may be shared among a plurality of nonvolatile memory cells, and it is no longer necessary to provide an element isolation layer for the plurality of memory cells sharing the source region.

Figure 22:
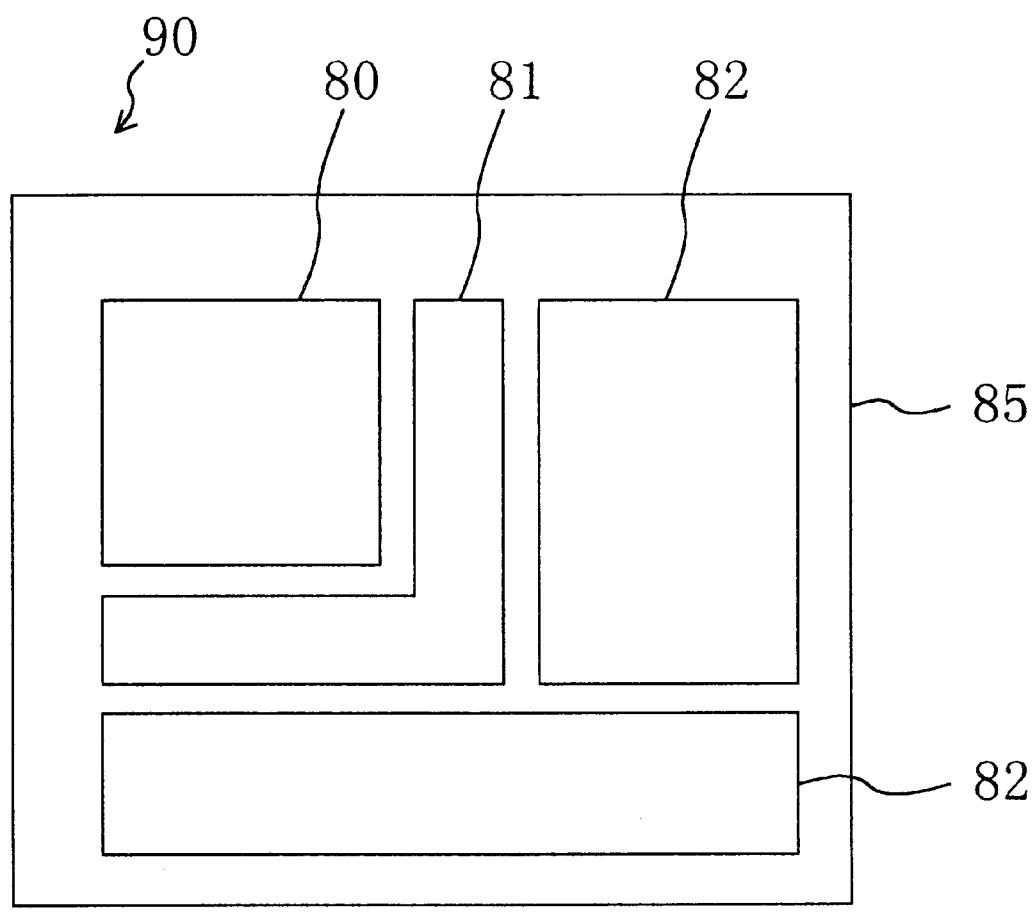
FIG. 22 is a diagram showing a configuration of the semiconductor integrated circuit device of the present invention.
Figure 23:
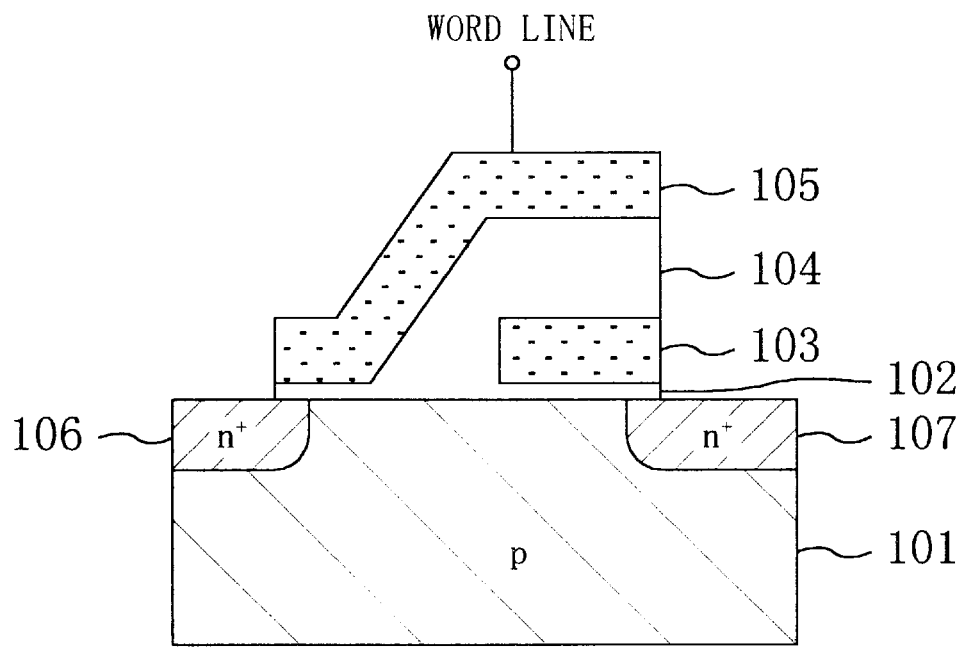
FIG. 23 is a cross-sectional view of a conventional nonvolatile semiconductor memory device.
Figure 24:
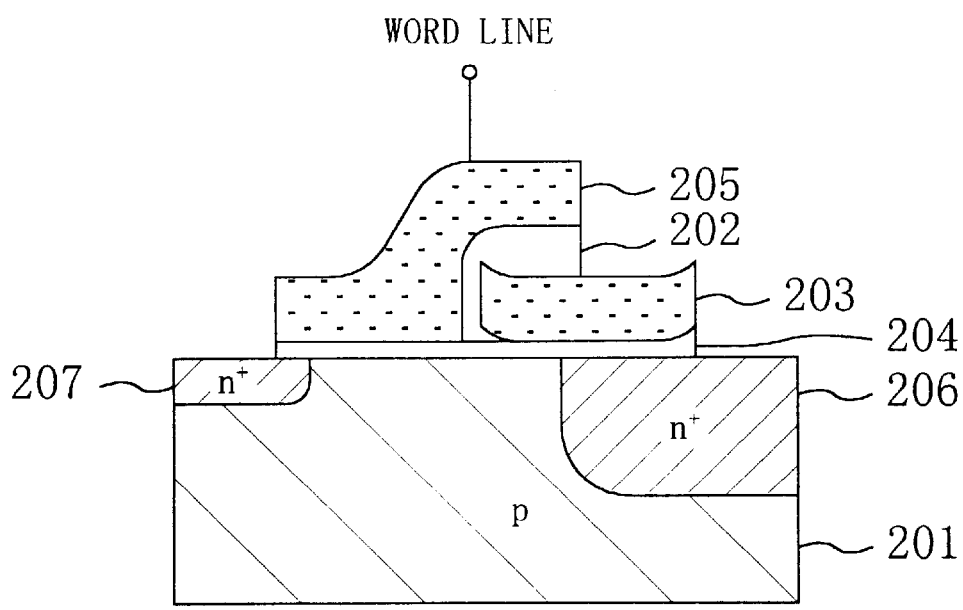
FIG. 24 is a cross-sectional view of another conventional nonvolatile semiconductor memory device.
Figure 25:
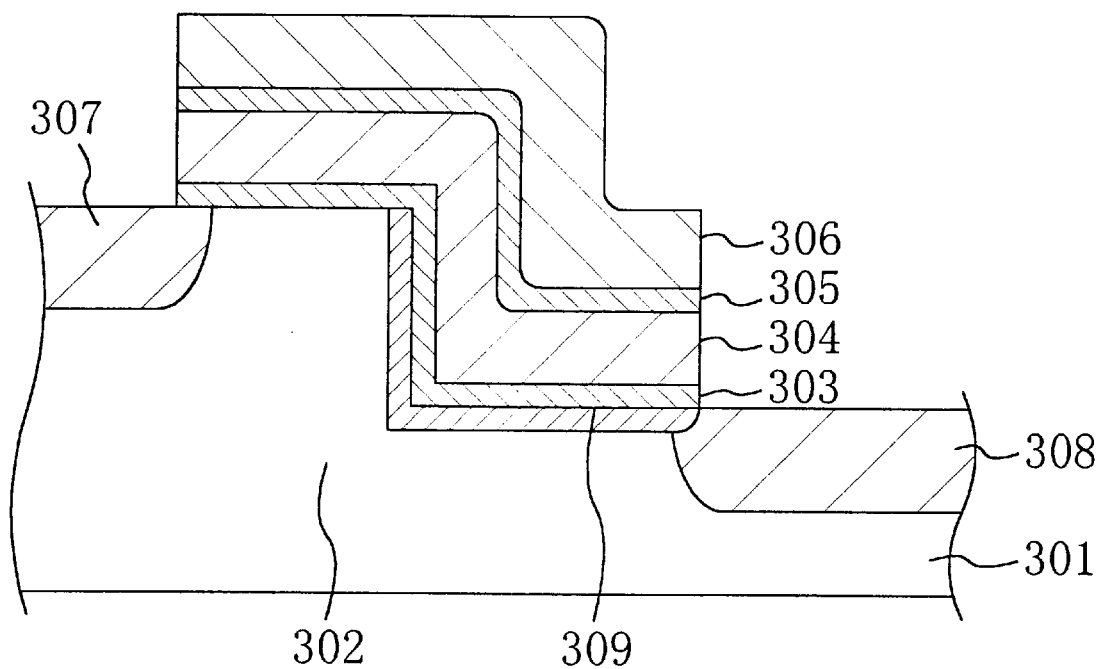
FIG. 25 is a cross-sectional view of still another conventional nonvolatile semiconductor memory device.
Figure 26A:
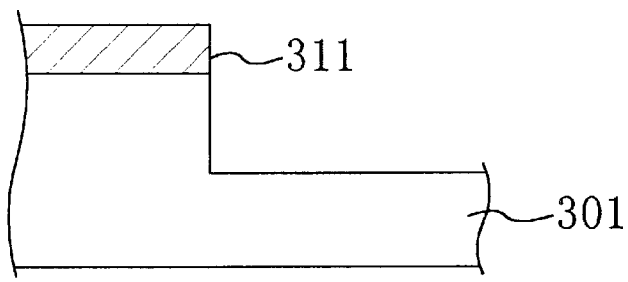
FIGS. 26A to 26E are cross-sectional views showing respective process steps for fabricating the device of FIG. 25.
Figure 26B:
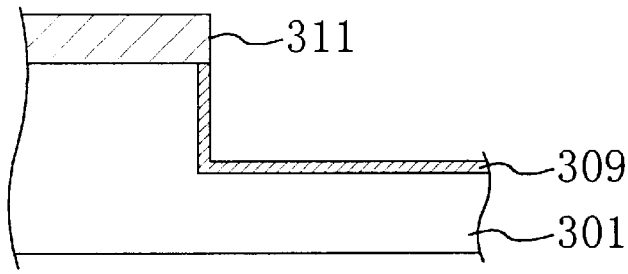
Figure 26C:
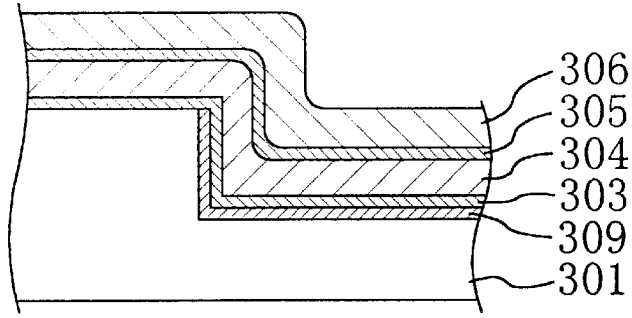
Figure 26D:
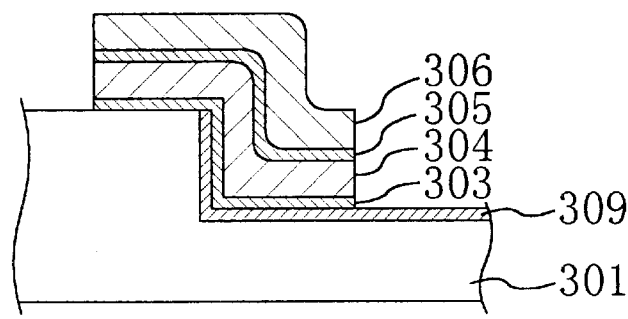
Figure 26E:
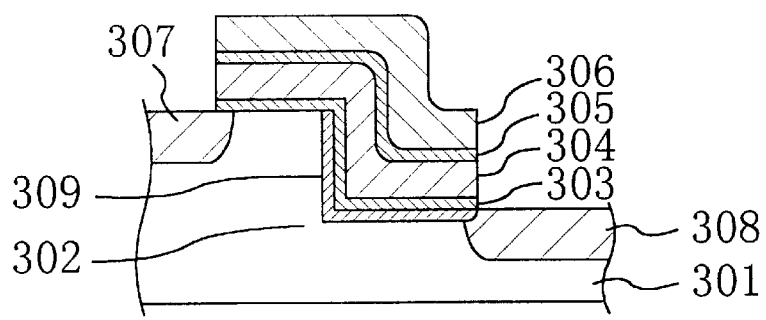

In the foregoing, the present invention has been described as being applied to a nonvolatile semiconductor memory device. Hereinafter, an embodiment of the semiconductor integrated circuit device of the present invention will be described with reference to FIG. 22.

The semiconductor integrated circuit device 90 of this embodiment is a digital signal processor (DSP). The semiconductor integrated circuit device 90 includes: a memory cell array section 80 including the nonvolatile semiconductor memory devices as nonvolatile memory cells in at least a part thereof; a peripheral circuit section 81 for driving the memory cell array section 80; and a processing circuit section 82 for performing digital signal processing on a common substrate (chip) 85. In the memory cell array section 80, a large number of nonvolatile memory cells are arranged in columns and rows. Each of the cells may have the configuration shown in FIGS. 1A and 1B, for example, or any arbitrary configuration of any of the other embodiments. Programs or data are stored in the memory section 80. In accordance with the contents to be stored therein, another memory block including memory cells other than the nonvolatile memory cells may also be provided. The processing circuit section 82 is further divided into a plurality of function blocks (not shown). Since these blocks are constituted by known processing circuit components such as control sections, arithmetic sections, multiplication sections, registers and the like, the detailed description thereof will be omitted herein. These components may be appropriately designed and arranged depending upon the intended application.

Since such a DSP includes the nonvolatile memories according to the present invention as at least a part of the memories thereof and the nonvolatile memories can perform the writing of data at a high speed, it is possible to realize satisfactorily high-speed processing required for a DSP. In addition, according to the present invention, the power supply voltage required for operating the nonvolatile memories can be reduced while maintaining the write speed into the nonvolatile memories at a practical level. As a result, a single power supply can be commonly used for the processing circuit section and the nonvolatile memory section, which is realized for the first time by using the nonvolatile memory of the present invention, which can write data at a high speed upon the application of a low voltage.

It is noted that the semiconductor integrated circuit device of the present invention is not limited to a DSP, but is widely applicable to various kinds of memory-incorporated logic VLSI's.

As has been described above, according to the present invention, a low-concentration drain region is formed in a semiconductor substrate having a step so as to cover the corner portion on the bottom of the step and to cover the bottom of the step. Thus, a "drain potential expansion region" can be formed in the channel region which is immediately under the floating gate. In addition, by providing a channel structure in which a low-concentration p$^-$ layer, a high-concentration p$^-$ layer and a low-concentration n$^-$ layer are disposed from the source toward the step side region, the intensity of the lateral electric field can be increased in the boundary between the inversion channel region which is immediately under the control gate and the "drain potential expansion region" which has been formed in the channel region. Since these effects can be attained, electrons can be injected into the step side region with a higher efficiency.

Moreover, by forming a drain region so as to cover the step side region and the bottom of the step, the coupling capacitance between the floating gate and the drain region can be increased. As a result, the electron injection efficiency can be further increased.

Furthermore, since the low-concentration drain region is formed so as to cover the step bottom corner and the bottom of the step, the electrons can be injected with a high efficiency not only in the step side region but also in the step bottom corner. The low-concentration drain region also executes the functions of suppressing the injection of holes into an oxide film and improving the erasure characteristics. In addition, it is also possible to employ a circuit configuration in which a source bias and a drain bias are exchanged during reading in order to suppress the degradation of a read disturb margin.

Consequently, the nonvolatile semiconductor memory device of the present invention provides a structure which realizes a high-efficiency injection with a low voltage and which is appropriate for very large-scale integration enabling high-speed read and write operations. In addition, the nonvolatile semiconductor memory device of the present invention can suppress the degradation of a retention time in erasing and reading data.

What is claimed is:

1. A nonvolatile semiconductor memory device comprising:
    a semiconductor substrate having a surface including a first surface region at a first level, a second surface region at a second level lower than the first level and a step side region linking the first and second surface regions together;
    a channel region formed in the first surface region of semiconductor substrate;
    source and drain regions which are formed in the surface of the semiconductor substrate so as to interpose the channel region therebetween;
    a first insulating film formed on the surface of the semiconductor substrate;
    a floating gate formed on the first insulating film; and
    a control gate which is capacitively coupled to the floating gate via a second insulating film,
    wherein the control gate is formed on the first insulating film, and
    wherein the drain region includes
    a low-concentration impurity layer which is formed in the second surface region, covers a corner portion between the second surface region and the step side region and does not reach the first surface region, and
    a high-concentration impurity layer which is connected to the low-concentration impurity layer and which is formed in a region distant from the channel region,
    an impurity concentration of the low-concentration impurity layer being lower than that of the high-concentration impurity layer, and
    wherein the floating gate covers a part of the first surface region, the step side region and a part of the second surface region via the first insulating film.

2. The nonvolatile semiconductor memory device of claim 1, wherein the channel region includes a high-concentration impurity region being located close to the step side region and having an impurity concentration higher than that of the channel region in a part thereof adjacent to the source region.

3. The nonvolatile semiconductor memory device of claim 1, wherein the channel region comprises, in the step side region, an extremely-low-concentration impurity diffusion layer having a conductivity type opposite to that of the drain region.

4. The nonvolatile semiconductor memory device of claim 1, wherein the channel region comprises, in the step side region, an extremely-low-concentration impurity diffusion layer having the same conductivity type as that of the drain region.

5. The nonvolatile semiconductor memory device of claim 1, wherein the first insulating film comprises a first part located between the control gate and the semiconductor substrate, and a second part located between the floating gate and the semiconductor substrate, the first part being thicker than the second part.

6. The nonvolatile semiconductor memory device of claim 1, wherein the source region comprises a high-concentration impurity layer which is formed in a region distant from the channel region, and a low-concentration impurity layer which is formed between the high-concentration impurity layer and the channel region, an impurity concentration of the low-concentration impurity layer being lower than that of the high-concentration impurity layer.

7. The nonvolatile semiconductor memory device of claim 1, wherein the corner portion between the second surface region and the step side region is constituted by a curved surface.

8. The nonvolatile semiconductor memory device of claim 3 or 4, wherein an impurity concentration in a part of the channel region which is adjacent to the extremely-low-concentration impurity diffusion layer is higher than an impurity concentration in a part of the channel region which is adjacent to the source region.

9. The nonvolatile semiconductor memory device of claim 3 or 4, wherein an impurity concentration of the extremely-low-concentration impurity layer of the channel region is lower than $3 \times 10^{18}$ cm$^{-3}$.

10. The nonvolatile semiconductor memory device of claim 1, wherein a part of the control gate partially overlaps with an upper surface of the floating gate.

11. The nonvolatile semiconductor memory device of claim 1, further comprising a conductive member being electrically in contact with the drain region and capacitively coupled to the floating gate via an insulating film formed on the floating gate, part of the conductive member overlapping with the floating gate.

12. A nonvolatile semiconductor memory device comprising:
a substrate having a surface including a first surface region at a first level, a second surface region at a second level lower than the first level and a step side region linking the first and second surface regions together;
a channel region formed in the first surface region of the substrate;
source and drain regions formed to interpose the channel region therebetween;
an insulating film formed on the surface of the substrate;
a floating gate formed on the insulating film; and
a control gate being capacitively coupled to the floating gate,
wherein the insulating film includes a first part formed on the first surface region, and a second part formed on the step side region and the second surface region, and
wherein the control gate is formed on the first part of the insulating film, and
wherein part of the floating gate faces the step side region through the second part of the insulating film, and another part of the floating gate faces the first surface region through the first part of the insulating film, and
wherein a boundary between the floating gate and the control gate is located at a position away from the step side region toward the source region, and
wherein the channel region includes a high-concentration impurity region being located close to the step side region, said high-concentration impurity region not covering a corner portion between the second surface region and the step side region, and said high-concentration impurity region having an impurity concentration higher than that of the channel region in a part thereof adjacent to the source region.

13. The nonvolatile semiconductor memory device of claim 12, wherein the impurity concentration of the channel region increases from a part thereof adjacent to the source region toward a position in the high-concentration impurity region where the impurity concentration is highest.

14. The nonvolatile semiconductor memory device of claim 12, wherein the drain region covers a corner portion between the second surface region and the step side region.

15. The nonvolatile semiconductor memory device of claim 14, wherein the drain region includes a low-concentration impurity layer, the low-concentration impurity layer reaching the first surface region.

16. The nonvolatile semiconductor memory device of claim 12, wherein an extremely-low-concentration impurity layer is formed in the step side region.

17. The nonvolatile semiconductor memory device of claim 16, wherein the conductivity type of the extremely-low-concentration impurity layer is the same as that of the channel region.

18. The nonvolatile semiconductor memory device of claim 16, wherein the conductivity type of the extremely-low-concentration impurity layer is opposite to that of the channel region.

19. A nonvolatile semiconductor memory device comprising:
a substrate having a surface including a first surface region at a first level, a second surface region at a second level lower than the first level and a step side region linking the first and second surface regions together;
a channel region formed in the first surface region of the substrate;
source and drain regions formed to interpose the channel region therebetween;
an insulating film formed on the surface of the substrate;
a floating gate formed on the insulating film; and
a control gate being capacitively coupled to the floating gate,
wherein the insulating film includes a first part formed on the first surface region, and a second part formed on the step side region and the second surface region, and
wherein the control gate is formed on the first part of the insulating film, and
wherein part of the floating gate faces the step side region through the second part of the insulating film, and another part of the floating gate faces the first surface region through the first part of the insulating film, and
wherein a boundary between the floating gate and the control gate is located at a position away from the step side region toward the source region, and
wherein an inversion layer is formed in the step side region during the operation of the device, and
wherein an extremely-low-concentration impurity layer is formed in the step side region.

20. The nonvolatile semiconductor memory device of claim 19, wherein the conductivity type of the extremely-low-concentration impurity layer is the same as that of the channel region.

21. The nonvolatile semiconductor memory device of claim 19, wherein the conductivity type of the extremely-low-concentration impurity layer is opposite to that of the channel region.

* * * * *